US008867000B2

(12) United States Patent
Hagiwara et al.

(10) Patent No.: US 8,867,000 B2
(45) Date of Patent: Oct. 21, 2014

(54) TRANSFLECTIVE TYPE LIQUID CRYSTAL DISPLAY DEVICE SUBSTRATE, COLOR FILTER SUBSTRATE, AND LIQUID CRYSTAL DISPLAY DEVICE

(71) Applicant: Toppan Printing Co., Ltd., Tokyo (JP)

(72) Inventors: Hidesato Hagiwara, Tokyo (JP); Mie Shimizu, Tokyo (JP); Kenzo Fukuyoshi, Tokyo (JP); Takao Taguchi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 101 days.

(21) Appl. No.: 13/715,090

(22) Filed: Dec. 14, 2012

(65) Prior Publication Data
US 2013/0107182 A1 May 2, 2013

Related U.S. Application Data

(63) Continuation of application No. PCT/JP2011/062812, filed on Jun. 3, 2011.

(30) Foreign Application Priority Data

Jun. 18, 2010 (JP) ................................. 2010-139672

(51) Int. Cl.
G02F 1/1335 (2006.01)
G02B 5/20 (2006.01)
(Continued)

(52) U.S. Cl.
CPC ........ *G02F 1/1335* (2013.01); *G02F 1/133371* (2013.01); *G02B 5/20* (2013.01);
(Continued)

(58) Field of Classification Search
CPC .................. G02F 1/133555; G02F 1/133371;
G02F 1/133514; G02F 1/133707; G02F 1/133753; G02F 1/1337; G02F 1/133512; G02F 1/1363; G02F 1/134309; G02F 1/134336; G02F 1/134363; G02F 2203/09; G02F 2413/09; G09G 2300/0456
USPC ........... 349/106, 96, 113, 123, 141, 138, 139, 349/108, 117, 110, 119, 129, 143, 114, 107
See application file for complete search history.

(56) References Cited

U.S. PATENT DOCUMENTS 6,977,701 B2 * 12/2005 Murai et al. ................... 349/114
2003/0160928 A1 8/2003 Ozawa et al.
(Continued)

FOREIGN PATENT DOCUMENTS

JP 5-2161 1/1993
JP 10-39128 2/1998
(Continued)

OTHER PUBLICATIONS

International Preliminary Report on Patentability mailed Jan. 24, 2013 for corresponding International Application No. PCT/JP2011/062812.

(Continued)

Primary Examiner — Thoi Duong

(57) ABSTRACT

The invention minimizes a disclination of a transflective type liquid crystal display device. The device includes a transparent substrate, a black matrix dividing rectangular pixels, a transparent electroconductive film, a resin layer having a concave region at an each pixel center, and a cell gap adjusting layer formed partially above the resin layer and forming convex regions above the black matrix. The pixels are formed symmetrically to a center and have a transmission region and a reflection region in an order that from a position near the center. In the transmission region, the resin layer is laminated above the transparent electroconductive film. In the reflection region, the resin layer and the cell gap adjusting layer are laminated above the transparent electroconductive film.

15 Claims, 13 Drawing Sheets

(51) Int. Cl.
  *G02F 1/1343* (2006.01)
  *G02F 1/1337* (2006.01)
  *G03F 7/20* (2006.01)
  *G02F 1/1333* (2006.01)

(52) U.S. Cl.
  CPC .......... *G02B 5/201* (2013.01); *G02F 1/133555* (2013.01); *G02F 1/134309* (2013.01); *G02F 1/133512* (2013.01); *G02F 1/133707* (2013.01); *G03F 7/20* (2013.01)
  USPC ........... 349/114; 349/110; 349/106; 349/138; 349/141

(56) References Cited

U.S. PATENT DOCUMENTS

| 2005/0231674 | A1 | 10/2005 | Nishimura |
| 2010/0007826 | A1 | 1/2010 | Lu et al. |

FOREIGN PATENT DOCUMENTS

| JP | 2859093 | 12/1998 |
| JP | 2004-198922 | 7/2004 |
| JP | 3957430 | 5/2007 |
| JP | 2007-199676 | 8/2007 |
| JP | 2008-181139 | 8/2008 |
| JP | 4167963 | 8/2008 |
| JP | 2008-242487 | 10/2008 |
| JP | 4364332 | 8/2009 |

OTHER PUBLICATIONS

International Search Report of Corresponding PCT Application PCT/JP2011/062812 mailed Aug. 2, 2011.

Extended European Search Report dated Jun. 25, 2014 in corresponding European Patent Application No. 11795579.9.

* cited by examiner

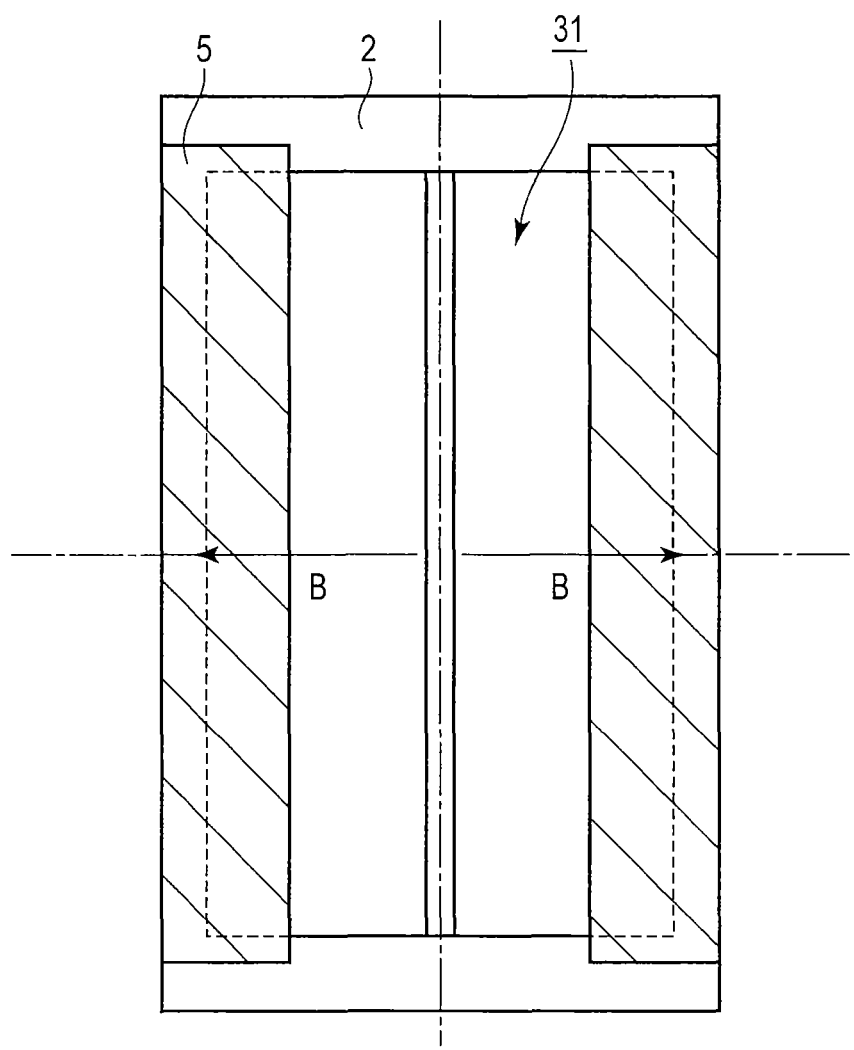
F I G. 7B

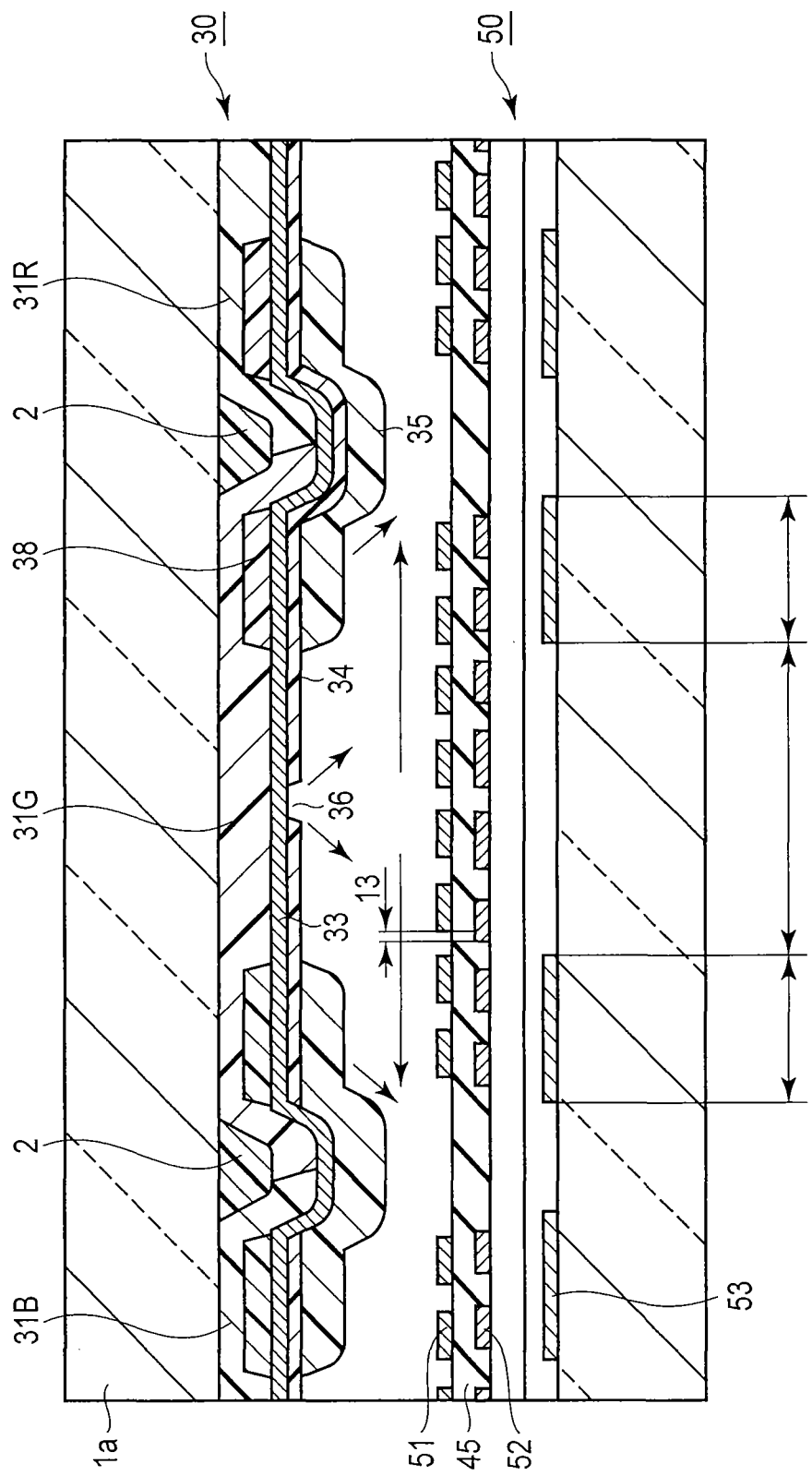
F I G. 11

TRANSFLECTIVE TYPE LIQUID CRYSTAL DISPLAY DEVICE SUBSTRATE, COLOR FILTER SUBSTRATE, AND LIQUID CRYSTAL DISPLAY DEVICE

CROSS REFERENCE TO RELATED APPLICATIONS

This application is a Continuation Application of PCT Application No. PCT/JP2011/062812, filed Jun. 3, 2011 and based upon and claiming the benefit of priority from prior Japanese Patent Application No. 2010-139672, filed Jun. 18, 2010, the entire contents of all of which are incorporated herein by reference.

BACKGROUND OF THE INVENTION

1. Field of the Invention

The present invention relates to a transflective type liquid crystal display device substrate, a color filter substrate, and a liquid crystal display device having any one of these. The invention relates particularly to a color filter substrate optimal for oblique electric field driving, and a liquid crystal display device having this.

2. Description of the Related Art

In recent years, it has been desired about a thin display device such as a liquid crystal display to make an image quality higher, decrease a price, and save an electric power. A color filter for the liquid crystal display device is requested to have a sufficient color purity, a high contrast, flatness, and other properties for attaining a higher image-quality display.

In order to gain a high image-quality liquid crystal display, liquid crystal alignment modes or liquid crystal driving modes such as VA (vertically alignment), HAN (hybrid-aligned nematic), TN (twisted nematic), OCB (optically compensated bend), CPA (continuous pinwheel alignment) or the like are suggested. As a result, wide-viewing-angle and high-speed-response liquid crystal display device has been put into practical use.

The liquid crystal display device in the VA mode, wherein liquid crystal molecules are aligned in parallel with a plane of a substrate such as a glass substrate, gives a wide viewing angle and cope easily with high-speed response. The liquid crystal display device in the HAN mode is effective for giving a wide viewing angle. For the liquid crystal display device in the VA mode, HAN mode, or the like, higher-level for color filter flatness (evenness of a film thickness, and a decrease in irregularities in a front surface of the color filter) and an electrical property such as dielectric constant or the like, is requested. Such high image-quality liquid crystal display device pursue, as a main theme, a technique of making the liquid crystal cell thickness (liquid crystal layer thickness) thinner to decrease coloration when the device is viewed from an oblique direction.

About the VA mode, developments of various improved modes have been advanced, examples of the modes including MVA (multi-domain vertically alignment), PVA (patterned vertically alignment), VAECB (vertically alignment electrically controlled birefringence), VAHAN (vertical alignment hybrid-aligned nematic), and VATN (vertically alignment twisted nematic) modes. A liquid crystal display device in a vertical electric field mode such as the VA mode, in which a drive-voltage is applied along the thickness direction of their liquid crystals, has, as main themes, a higher-speed liquid crystal response, a wide viewing angle technique, and a higher transmittance. The MVA technique is a technique of creating plural rib-form projection or slits for overcoming a problem that vertically aligned liquid crystals are instable at a time of a liquid-crystal-drive-voltage applying (a direction in which the liquid crystals initially having vertical alignment to a front surface of a substrate are inclined at the time of the voltage-applying, is not easily settled); and is a technique of forming liquid crystal domains between these ribs, and further forming domains aligned in plural directions, thereby ensuring a wide viewing angle.

Japanese Patent No. 3957430 discloses a technique of using first and second alignment-regulating structures to form liquid crystal domains. Jpn. Pat. Appln. KOKAI Publication No. 2008-181139 discloses a technique of using optical alignment to form four liquid crystal domains. This patent literature discloses that the following are necessary for ensuring a wide viewing angle: alignment treatment to be conducted plural times, which is related to a strict control of a tilt angle (into, for example, 89 degrees) in each domain; and alignment axes different in angle from each other by 90°, when viewed in plan, in order to form the domains.

Japanese Patent Nos. 2859093 and 4364332 each disclose a technique of using a transparent electroconductive film (a transparent electrode, a display electrode or a third electrode) of the color filter substrate side, and first and second electrodes of the array substrate side to control vertically aligned liquid crystals by use of an oblique electric field. According to Japanese Patent No. 2859093, liquid crystals having a negative dielectric constant anisotropy are used. Japanese Patent No. 4364332 discloses, in the claims and the text of the specification thereof, liquid crystals having a positive dielectric constant anisotropy. Japanese Patent No. 4364332 never describes any liquid crystal having the negative dielectric constant anisotropy.

Japanese Patent No. 4167963 relates to a transflective type liquid crystal display device using the negative dielectric constant anisotropy, and discloses a technique of forming electrode slits (electrode openings) to a common electrode above a color filter and further forming convex regions over pixels that are transmission regions of the color filter.

Usually, a liquid crystal display device in the VA mode, the TN mode, or some other mode has a basic structure wherein liquid crystals are sandwiched between a color filter substrate having a common electrode, and a pixel electrode (for example, a transparent electrode formed into a comb-teeth-form pattern and connected electrically to a TFT element) for driving the liquid crystals and an array substrate. In this structure, a drive-voltage is applied between the common electrode of the color filter and the pixel electrode formed to the array substrate side to drive the liquid crystals. A transparent electroconductive film as the pixel electrode, or the common electrode on a surface of the color filter is usually a thin film of an electroconductive metal oxide, such as ITO (indium tin oxide), IZO (indium zinc oxide), or IGZO (indium gallium zinc oxide).

As a technique disclosing a color filter, for example, a blue pixel, green pixel, red pixel and black matrix, Jpn. Pat. Appln. KOKAI Publication No. 10-39128 discloses, for example, a technique of forming a transparent electroconductive film over a black matrix and color pixel, and further laminating an overcoat.

BRIEF SUMMARY OF THE INVENTION

Technical Problems

As described above, in the vertically aligned liquid crystal display device, the domains of the liquid crystals are formed by use of alignment-regulating structures called ribs or slits to ensure the wide viewing angle (MVA technique). Specifically, when the liquid crystals have the negative dielectric constant anisotropy and the drive-voltage is applied to the liquid crystals at a position between two ribs made of resin and formed above, for example, a color filter, the liquid crystals are inclined into a direction perpendicular to the ribs when viewed in plane. Thus, the liquid crystals are aligned horizontally to the substrate plane. However, the liquid crystals at a center of a space between the two ribs are not settled into a single direction notwithstanding the voltage-applying, so that the liquid crystals may be turned into spray alignment or bend alignment. Such an alignment turbulence of the liquid crystals gives a grain feeling or unevenness to liquid crystal display. Moreover, in the MVA mode, such a quantitative level that the liquid crystals are inclined is not minutely controlled with ease by the drive-voltage so as to cause a problem against half-tone display besides the above-mentioned problem. The linearity between the drive-voltage and a display (i.e., response time) is particularly low to cause a problem against a half-tone display based on a low drive-voltage.

For solving these problems, extremely effective is a manner of using first, second and third electrodes to control the alignment of the liquid crystals by effect of the oblique electric field, as described in Japanese Patent Nos. 2859093 and 4364332. The oblique electric field makes it possible to control the direction in which the liquid crystals are inclined. Moreover, the oblique electric field makes it easy to control the quantitative level that the liquid crystals are inclined to produce a large advantageous effect for half-tone display.

However, even these techniques are insufficient as countermeasures against a disclination of the liquid crystals. The disclination is a problem that in a pixel (the pixel is a minimum unit for display based on liquid crystals and is identical in meaning with a rectangular pixel described in the invention), regions having different light transmittances are generated by an unintended alignment turbulence of the liquid crystals or non-alignment thereof.

According to Japanese Patent No. 2859093, in order to fix a disclination at the center of each pixel, an alignment control window having no transparent electroconductive film is located at a pixel-center portion of a counter electrode (third electrode). However, this literature never discloses any countermeasure for overcoming a disclination in the periphery of the pixel. Moreover, the literature does not disclose any countermeasure for minimizing the disclination although the disclination at the pixel center can be fixed. Furthermore, the literature does not describe a technique for improving the liquid crystals in response.

According to Japanese Patent No. 4364332, a dielectric layer is laminated to the transparent electroconductive film (transparent electrode), and the effect of the oblique electric field is favorably increased accordingly. However, as illustrated in FIG. 7 in Japanese Patent No. 4364332, a vertically aligned portion of liquid crystals remain at the center of each pixel and at an edge portion of each pixel even after a voltage is applied thereto, so as to cause a problem that the pixel is reduced in transmittance or aperture rate. When the liquid crystals having the positive dielectric constant anisotropy are used (Patent Literature 5 discloses, in the description and Examples thereof, no liquid crystal having the negative dielectric constant anisotropy), the pixel is not easily improved in transmittance because of the disclination at the pixel center. Thus, this technique is a technique that is unlikely to be adopted for the transflective type liquid crystal display device. Furthermore, Japanese Patent No. 4364332 does not suggest any structure wherein a transparent electroconductive film is laid over a black matrix.

Japanese Patent No. 4167963 discloses a technique of forming a convex region at the center of the pixel that is each of transmission regions of a color filter, and further making use of each electrode slit to cause an alignment disturbance (disclination) not to be easily generated, as disclosed in claim 1 and FIG. 3. However, this technique is applied only to a transmission region, a reflection region, and the liquid crystals at the center of each of the pixels. This patent literature does not describe a disclination at an edge portion or a corner portion of the pixel, so that countermeasures thereagainst are not considered. The patent literature neither demonstrates a countermeasure for minimizing any disclination, nor describes a technique for improving the response of the liquid crystals.

In the above-mentioned situation, an object of the invention is to provide a vertically-aligned-mode liquid crystal display device, in particular, to provide a color filter substrate suitable for a transflective type or reflection type liquid crystal display device and further to provide a liquid crystal display device.

Solution to the Problems

A first aspect of the present invention provides a transflective type liquid crystal display device substrate, including: a transparent substrate; a black matrix formed above the transparent substrate, and having openings that divide rectangular pixels, respectively; a transparent electroconductive film formed above the transparent substrate and the black matrix; a resin layer formed above the transparent electroconductive film, and having a concave region at a center of each of the pixels; and a cell gap adjusting layer formed partially above the resin layer, and forming convex regions with the resin layer above the black matrix; wherein the rectangular pixels are each formed symmetrically to a center that is the concave region of the resin layer, and each formed to have a transmission region and a reflection region in an order that from a position near the center; in the transmission region, the resin layer is laminated above the transparent electroconductive film; and in the reflection region, the resin layer and the cell gap adjusting layer are laminated above the transparent electroconductive film.

A second aspect of the present invention provides a transflective type liquid crystal display device substrate, including: a transparent substrate; a black matrix formed above the transparent substrate, and having openings that divide rectangular pixels, respectively; a color layer formed above the transparent substrate and the black matrix, and forming the rectangular pixels; a transparent electroconductive film formed above the color layer; a resin layer formed above the transparent electroconductive film, and having a concave region at a center of each of the pixels; and a cell gap adjusting layer formed partially above the resin layer, and forming convex regions with the resin layer above the black matrix; wherein the rectangular pixels are each formed symmetrically to a center that is the concave region of the resin layer, and each formed to have a transmission region and a reflection region in an order that from a position near the center; in the transmission region, the resin layer is laminated above the transparent electroconductive film; and in the reflection region, the resin layer and the cell gap adjusting layer are laminated above the transparent electroconductive film.

A third aspect of the present invention provides a liquid crystal display device, including: the liquid crystal display device substrate of the first and second aspect; a liquid crystal layer; and an array substrate arranged oppose to the liquid crystal display device substrate via the liquid crystal layer, and including elements arranged in a matrix form to drive liquid crystal molecules of the liquid crystal layer; wherein the array substrate includes first and second electrodes different in electric potential from each other to drive the individual rectangular pixels.

BRIEF DESCRIPTION OF THE SEVERAL VIEWS OF THE DRAWING

FIG. 7B is a plan view illustrating an example of a pattern of a black matrix and a light scattering layer of one pixel of a liquid crystal display device according to an embodiment of the invention when the pixel is viewed in plan;

FIG. 11 is a section view of a liquid crystal display device according to a fifth embodiment of the invention.

DETAILED DESCRIPTION OF THE INVENTION

Figure 1:
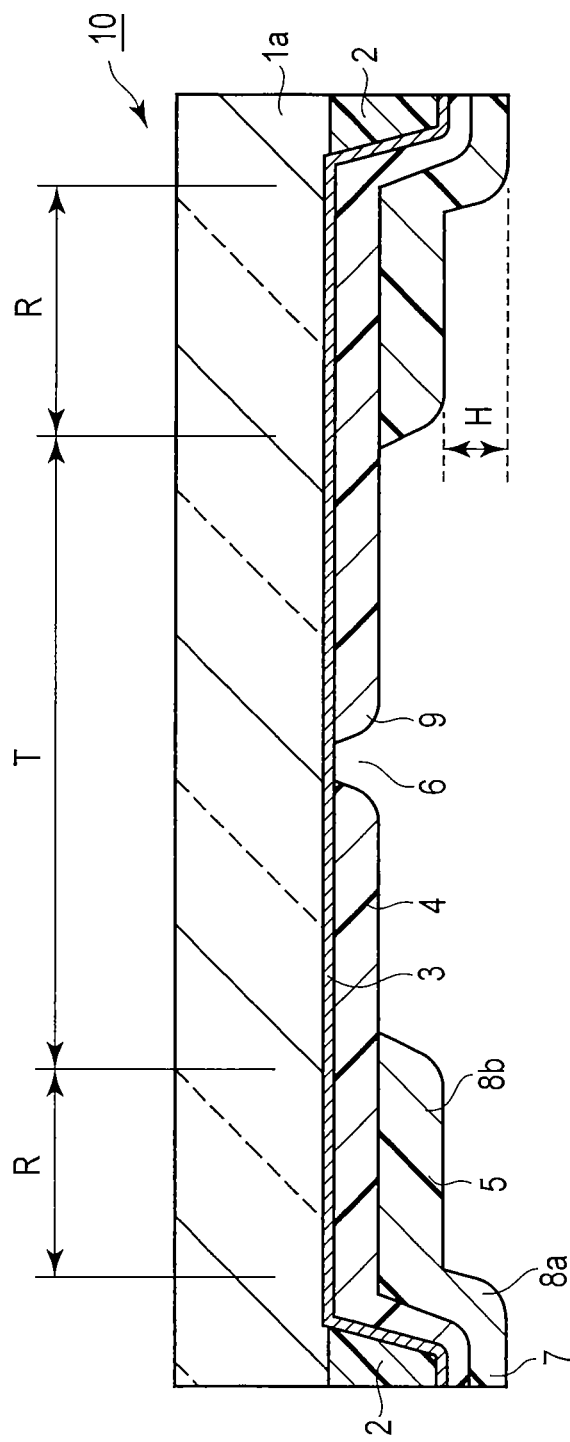
FIG. 1 is a sectional view illustrating a liquid crystal display device substrate according to a first embodiment of the present invention.

Hereinafter, an embodiment of the invention will be described.

A substrate for a transflective type liquid crystal display device according to a first aspect of the invention includes: a transparent substrate; a black matrix formed above the transparent substrate, and having openings that divide rectangular pixels, respectively; a transparent electroconductive film formed above the transparent substrate and the black matrix; a resin layer formed above the transparent electroconductive film, and having a concave region at a center of each of the pixels; and a cell gap adjusting layer formed partially above the resin layer, and forming convex regions above the black matrix with the resin layer. The rectangular pixels are each formed symmetrically to a center that is each of the concave regions of the resin layer, and each formed to have a transmission region and a reflection region in an order that from a position near the center; in the transmission region, the resin layer is laminated above the transparent electroconductive film; and in the reflection region, the resin layer and the cell gap adjusting layer are laminated above the transparent electroconductive film.

In this transflective type liquid crystal display device substrate, a level A of a height of a front surface of the resin layer from a front surface of the transparent substrate above the black matrix, a level B of a height of a front surface of the resin layer in the reflection region therefrom, and a level C of a height of a front surface of the resin layer in the transmission region therefrom satisfy a relationship of A>B>C, and a level of a bottom of the concave region of the resin layer is lower than the respective levels A, B and C of the front surfaces of the resin layer.

A thickness of the cell gap adjusting layer may be about ½ of a thickness of a liquid crystal layer of the liquid crystal display device.

The cell gap adjusting layer may be a light scattering layer.

The cell gap adjusting layer may be a ¼-wavelength layer.

A substrate for a transflective type liquid crystal display device according to a second aspect of the invention includes: a transparent substrate; a black matrix formed above the transparent substrate, and having openings that divide rectangular pixels, respectively; a color layer formed above the transparent substrate and the black matrix, and forming the rectangular pixels; a transparent electroconductive film formed above the color layer; a resin layer formed above the transparent electroconductive film, and having a concave region at a center of each of the pixels; and a cell gap adjusting layer formed partially above the resin layer, and forming convex regions with the resin layer above the black matrix. The rectangular pixels are each formed symmetrically to a center that is the concave region of the resin layer, and each formed to have a transmission region and a reflection region in an order that from a position near the center; in the transmission region, the resin layer is laminated above the transparent electroconductive film; and in the reflection region, the resin layer and the cell gap adjusting layer are laminated above the transparent electroconductive film.

In this transflective type liquid crystal display device substrate, a thickness of the color layer located in the reflection region may be about ½ of a thickness of the color layer located in the transmission region.

It is allowable that a ¼-wavelength layer is laminated above the color layer in the reflection region, and a light scattering layer is laminated above the ¼-wavelength layer via the transparent electroconductive film.

It is allowable that a light scattering layer is laminated above the color layer in the reflection region, and a ¼-wavelength layer is laminated above the light scattering layer via the transparent electroconductive film.

A liquid crystal display device according to a third aspect of the invention includes: the liquid crystal display device substrate according to the first aspect; a liquid crystal layer; and an array substrate arranged oppose to the liquid crystal display device substrate via the liquid crystal layer, and including elements arranged in a matrix form to drive liquid crystal molecules of the liquid crystal layer. The array substrate includes first and second electrodes which are different in electric potential from each other to drive the individual rectangular pixels.

In this liquid crystal display device, motions of the liquid crystals may be motions that at a time of liquid-crystal-drive-voltage applying, the liquid crystals are inclined centrosymmetrically or linearly symmetrically from the concave region at the center of each of the rectangular pixels to directions into sides of the black matrix when viewed in plan.

Motions of the liquid crystals in each of the rectangular pixels of the liquid crystal display device at a time of liquid-crystal-drive-voltage applying may be motions divided into 4 by straight lines passing through a cross-form concave region at the center of the rectangle pixel when viewed in plan.

The display device may have a structure wherein: the first electrode has a comb-teeth-form pattern connected to an active element for driving the liquid crystals; the second electrode has a comb-teeth-form pattern equivalent to that of the first electrode, and is included below the first electrode via an insulating layer; and the pattern of the second electrode is protruded from the pattern of the first electrode into a direction along which the liquid crystals are inclined.

The first and second electrodes may each include electroconductive metal oxides which is transparent in a range of visible wavelengths.

The liquid crystals may be liquid crystals having a negative dielectric constant anisotropy.

According to an embodiment of the invention, which have the above-mentioned structures, it is possible to provide a liquid crystal device electrode-substrate that is an optimal for a liquid crystal display device, and further provide a brighter liquid crystal display device. In the liquid crystal display device according to the embodiment of the invention, alignment treatment for the color filter substrate or array substrate can be decreased, and further a response of the liquid crystals can be improved. Moreover, a disclination of the liquid crystals can be decreased by alignment of the liquid crystals in step regions and shoulder portions of the concave regions, and an oblique electric field generated by an electrode structure including the first and second electrodes and the transparent electroconductive film. As a result, a liquid crystal display can be improved.

According to the embodiment of the invention, after the drive-voltage applying, an inclination angle of the liquid crystals can be caused to have a distribution in a unit of ½ or ¼ of one of the pixels. Furthermore, the structure wherein the resin layer is laminated above the transparent electroconductive film makes it possible to overcome a gradation (tone) shift (meaning that a half tone is sifted toward a white or black side so that a sufficient gradation representation cannot be attained) caused in conventional liquid crystal devices.

According to the liquid crystal display device electrode-substrate and the liquid crystal display device according to the embodiment of the invention, at a time of voltage-applying, two or more regions including different alignment states are present in each of the pixels, so that a liquid crystal display can be averaged and a wide viewing angle can be gained. Moreover, in the reflection region, the resin layer which is a dielectric, and the cell gap adjusting layer are laminated above the transparent electroconductive film, thereby making it possible to make a voltage to be applied to the liquid crystal layer in the reflection region substantially equal to a voltage to be applied to the liquid crystal layer in the transmission region although a thickness of the liquid crystal layer in the reflection region is about ½ of a thickness of the liquid crystal layer in the transmission region. For this reason, a voltage dependency of reflected light of the reflection region is made equivalent to a voltage dependency of transmitted light of the transmission region, thereby making it possible to attain an even display having no incompatibility between the reflection and transmission regions.

In the embodiment of the invention, the transparent electroconductive film is laminated to cover an effective display pixel of a color filter, thereby making it possible to provide, as a secondary advantage, a liquid crystal display device that is not easily affected by an external electric field, this situation being different from a situation of the IPS (driving liquid crystals by a transverse electric field) or FFS (driving liquid crystals by an electric field generated in a fringe of a comb-teeth electrode) mode.

Hereinafter, various embodiments of the invention will be described with reference to drawings.

An embodiment of the invention is applicable to liquid crystals having initial alignment of vertical alignment, and has a prerequisite condition in which a black matrix substrate (substrate wherein a black matrix is formed above a transparent substrate) or a color filter substrate is arranged opposite to an array substrate wherein liquid crystal driving elements such as TFTs are formed, and then laminating these substrates to each other to sandwich the liquid crystal layer for vertical alignment therebetween. Additionally, the embodiment of the invention is a technique of making use of an oblique electric field generated by an electrode structure as described in the following: a transparent electroconductive film that is a third electrode is arranged above the color filter substrate; and a first electrode that is a pixel electrode, and a second electrode which is different in electric potential from the first electrode are arranged to the array substrate.

A material of each of the first and second electrodes of the array substrate side of the liquid crystal display device according to the embodiment of the invention may be a thin film including an electroconductive metal oxide such as ITO. Alternatively, the material may be a thin film including a metal better in electroconductivity than the metal oxide thin film. When the liquid crystal display device is a reflection type or transflective type liquid crystal display device, at least one of the first and second electrodes may be a thin film including aluminum or an aluminum alloy.

The liquid crystals usable in an embodiment of the invention are liquid crystals having vertical alignment as initial alignment thereof (at the time of no drive-voltage applying). A dielectric constant anisotropy of the liquid crystals may be positive or negative. When the liquid crystals having a negative dielectric constant anisotropy are applied to the invention, an alignment treatment for setting a tilt angle can be omitted. In other words, the vertically aligned film used in the invention needs only to be subjected to heat treatment after the film is formed by printing. Thus, rubbing treatment, optical alignment or the like can be omitted. When the liquid crystals having the negative dielectric constant anisotropy are applied to the invention, a transmittance of respective centers of the rectangular pixels can be raised to make it possible to provide a color filter substrate wherein importance is attached to brightness rather than color purity, for example, a color filter substrate suitable for a transflective type liquid crystal display device.

FIG. 1 is a sectional view illustrating a substrate 10 for a transflective type liquid crystal display device according to a first embodiment of the invention. This substrate 10 includes no color filter, and will be hereinafter referred to as the black matrix substrate (BM substrate). In FIG. 1, the BM substrate 10 is formed by forming, above a transparent substrate 1a, a black matrix 2, a transparent electroconductive film (third electrode) 3, a resin layer 4, and a cell gap adjusting layer (light scattering layer) 5 in this order. Rectangular pixels formed to openings in the black matrix 2 each include a reflection region R and a transmission region T. The cell gap adjusting layer (light scattering layer) 5 is formed above the resin layer 4 in the reflection region R. A linear concave region 6 is formed at a center of the resin layer 4 in each of the pixels.

The inventors have found out that for the control of liquid crystal alignment, the following can be used: shoulder portions 8a and 8b, as steps, between a convex region 7 projected above the black matrix 2 and the cell gap adjusting layer (light scattering layer) 5; and a shoulder portion 9 of the concave region 6 formed at the center of each of the rectangular pixels. The inventors have suggested a novel technique by combining this finding with the third electrode 3 (transparent electroconductive film).

In this embodiment, liquid crystal alignment in the inclined portion of the convex region 7 formed above the black matrix 2 is used for inclining the liquid crystals at the time of the drive-voltage applying. In the same manner as in the concave region 6 at the center of the pixel, liquid crystal alignment in the shoulder portion 9 of the concave region 6 is used for inclining the liquid crystals. Motions of the liquid crystals will be described later. When the substrate 10 includes a color filter, convex regions may be formed by a lamination (overlap) region of adjacent color pixels having two different colors.

A height H of a top of the convex region 7 from a front surface of the cell gap adjusting layer 5 in the reflection region R ranges preferably from 0.4 to 2 µm. If the height is less than 0.4 µm, the convex region does not produce a sufficient advantageous effect of functioning as a "trigger for inclining the liquid crystals" at the time of the voltage-applying. If the height is more than 2 µm, a hindrance is caused to the flow of the liquid crystals when liquid crystal cells are formed.

Hereinafter, a brief description will be made about structure elements of the above-mentioned transflective type liquid crystal display device substrate.
(Black Matrix and Rectangular Pixels)

A black matrix is a light-shielding pattern around pixels that are each a minimum unit for display, or along both sides of the pixels in order to increase a contrast for liquid crystal display. The light-shielding layer is a coated film wherein light-shielding pigments are dispersed in a transparent resin, and generally formed by giving photosensitivity and patterning in a photolithographic manner including light exposure and development. Rectangular pixels denote openings of the black matrix, and have the same meaning as the above-mentioned pixels.

Each of the inclined portions of the black matrix may have a roundish shape, and a sectional shape of the black matrix of the display region may be, for example, a semilunar, trapezoidal, triangular shape, or the like. The inclination angle of the black matrix from the substrate plane may be not particularly specified as far as the height of the convex region is more than 0.4 µm. Expect an aperture rate (transmittance of the rectangular pixel), the angle may be a low inclination angle such as 2° or 3°, and may need only not to give a reverse-tapered form (the form of an upside-down trapezoid, the upper side of the trapezoid is long). However, the inclination angle is preferably from 30 to 80° to restrict the aperture rate effectively.
(Transparent Electroconductive Film)

The transparent electroconductive film formed above the liquid crystal display device substrate may be a thin film including a metal oxide such as ITO. A position where the transparent electroconductive film is formed is preferably a position above the black matrix formed around the rectangular pixels in order to make use of the oblique electric field.

It is particularly desired to further form the transparent electroconductive film above the black matrix, which is higher than a position of the transparent electroconductive film above the pixel of the transmission region, to give a difference to the inter-electrode distances between the transparent electroconductive film and a pixel electrode (hereinafter referred to as a first electrode) of the array substrate side.

As will be described later, it is allowable to form a color layer above the black matrix, and form the transparent electroconductive film above this color layer.
(Resin Layer)

The resin layer is formed above the above-mentioned transparent electroconductive film. The resin layer may be formed by an organic resin which is transparent and resistant against heat. It is advisable to optimize a thickness of the resin layer based on a relationship between the thickness of the resin layer and the cell gap (a thickness of a liquid crystal layer) of used liquid crystals, or a relationship between the thickness of the resin layer and an electrical property of the liquid crystals. From these viewpoints, the thickness of the liquid crystal layer can be made large when the thickness of the resin layer is small. When the film thickness of the resin layer is large, the thickness of the liquid crystal layer can be made small accordingly. The resin layer may be a transparent organic resin, such as an acrylic resin that will be described later in Examples. The thickness of the liquid crystal layer usable in the transmission region is from 2 to 5 µm, preferably about 4 µm. The thickness of the liquid crystal layer in the reflection region is about ½ of that in the transmission region.
(Color Layer and Color Pixels)

The color layer is a coated film wherein organic pigments that will be described later are dispersed in a transparent resin. When the display device substrate is a color filter substrate, color pixels are obtained by forming the color layer into a pattern form above the rectangular pixels by a photolithographic manner. For the color pixels, plural colors can be adopted from yellow, magenta, cyan, white and other colors besides the three primary colors of red, green and blue.

In the specification, when the color filter substrate is used, the color pixels in plural colors and the light-shielding layer including the black matrix are called a color filter. A color filter substrate includes the color filter which is formed above a transparent substrate such as a glass substrate. In the specification, substantially the same film thickness denotes a film thickness that is able to be controlled by the producing process in the formation of the light-shielding layer or the color layer, within, e.g., ±0.2 µm of a set film thickness which is a production margin in the producing process in the color filter.

The film thickness of each color pixel denotes a height of a front surface of a center of each color pixel (denoting a pixel center in the color layer of the transmission region) from a front surface of the transparent substrate. It is preferred to set a ratio of the film thickness of the color layer in the reflection region to the film thickness of the color layer in the transmission region into a range of ½ to ¼. The film thickness of the color layer in the reflection region that gives a value of ½ as the film thickness ratio denotes that the film thickness of the color layer is ½ of the thickness of the color layer within a range of an error of ±0.2 µm. By setting, into about ½, the ratio of the film thickness of the color layer in the reflection region to the film thickness of the color layer in the transmission region, an original color display about which an optical path difference between the transmission region and reflection region is considered can be attained.

The reflection region may be observed in a bright environment, such as the outdoor, and brightness of the reflection region is important. It is desired that a chromaticity range of the transmission region is consistent with a chromaticity range of the reflection region. However, when importance is given to brightness as much as possible, it is sufficient for the reflection region to be recognizable to be colored. For example, reflection display is desired to be made into a high color in brightness by setting the film thickness ratio to ⅓ or ¼ when the reflection display is used for a purpose about which more importance should be given to "brightness" than to color matching with transmission region display (for example, when the reflection display is used in the outdoor, to which sunshine is given).

When the chromaticity range of the transmission region for a static display (static image) is adjusted to give an NTSC ratio of about 70%, which is a standard level, the NTSC ratio of the reflection region becomes about 35 to 40% when the reflection region has a ¼ film thickness (in a case where light is transmitted two times therethrough). When the NTSC ratio is from 35 to 40%, the reflection region is easily recognizable to be colored. If the ratio falls largely below this range, the reflection region is not easily recognizable to be colored. It is therefore desired that the film thickness of the reflection region is ¼ or more, which permits the NTSC ratio to be in the range of about 35 to 40%.

The perceptibility of colors in a moving image gradation-display tends to be lower than that of colors in a static image display. In a case where the film thickness of a concave region of the color layer is ¼ of the film thickness of the color layer, the film thickness of the concave region of the color layer is substantially a lower-limit film thickness permitting a color display to be easily recognized when a moving image gradation-display is made; however, this lower-limit film thickness depends on an individual difference between users (observers). A height of a laminated (overlapped) region of adjacent color pixels (the laminated region will be referred to as a convex region hereinafter) is defined as a height from a top of the convex region to a front surface of a center of the color pixel. Color pixels in plural colors are represented by a blue pixel, a red pixel, a green pixel, a yellow pixel, a white pixel (transparent pixel), and others.

The color layer may be a layer wherein plural organic pigments that will be described later are incorporated and dispersed into the transparent resin. In many cases, organic pigments have dielectric constants subtly different from each other or dielectric losses different from each other. The transflective type liquid crystal display device substrate according to this embodiment has a structure wherein the color layer (or color pixels) that is varied in these electric properties is covered with the transparent electroconductive film; thus, an effect of the color layer onto a voltage applied to the liquid crystal layer can be removed, to make it possible to obtain effective use of the oblique electric field.

(Cell Gap Adjusting Layer)

The cell gap adjusting layer is formed to adjust an optical path difference of the liquid crystal layer between the transmission region and the reflection region in the transflective liquid crystal display device. The cell gap adjusting layer can function also as a light scattering layer necessary for the reflection region. The cell gap adjusting layer may be formed by a photolithographic process one time, using the same material as the above-mentioned resin layer, and a gray tone mask.

In general, for the reflection region of the transflective type liquid crystal display device in the vertical alignment mode, a ¼-wavelength retardation layer (hereinafter referred to as the ¼-wavelength layer) becomes necessary to compensate for retardation (phase difference) between the liquid crystals of the transmission region and the reflection region. Thus, the cell gap adjusting layer can be caused to have a retardation function. A light scattering layer or a ¼-wavelength layer may be formed to the color filter side of the transparent substrate side below the transparent electroconductive film.

As will be detailed in Examples that will be given later, it is preferred to cause a cell gap adjusting layer having a structure wherein a ¼-wavelength layer is arranged to the color filter side to have a light scattering function. The light scattering layer functions as a diffuser for giving diffusing performance to an emission light, making the emission light which is caught by observer's eyes from the liquid crystal display device paper-white-state, and attaining a display good in perceptibility.

A difference in height between a front surface of the cell gap adjusting layer and a front surface of the color pixel in the transmission region can be set, when the liquid crystal device is formed, to about ½ of the thickness of the liquid crystal layer. The value of about ½ of the thickness of the liquid crystal layer may be varied within a range of 10% of the thickness of the liquid crystal layer, and is desired to be within ±0.2 rim, which is a production margin in the process of producing the color filter.

(Light Scattering Layer)

The light scattering layer is a layer wherein amorphous fine particles of a single or plural species are dispersed in a matrix resin (the resin may be referred to as the transparent resin hereinafter) which is different in refractive index therefrom, and is an optically functional film for scattering an incident light to give paper-white-state effect to observer's eyes. The matrix resin needs only to have heat resistance and be a transparent resin that transmits visible-wavelength-light rays. A film thickness of the light scattering layer is preferably from about 1.5 to 5 μm by a relationship between a diameter of the amorphous fine particles, the wavelength of the light, adaptability to the producing process, and the film thickness of the light scattering layer.

Examples of the amorphous fine particles of the light scattering layer include fine particles made of an organic substance, and fine particles made of an organic polymer. The fine particles are amorphous; thus, in particular, organic polymer fine particles are mainly used. However, even when the fine particles are inorganic substance fine particles, no problem is caused as far as the particles are amorphous. The amorphous fine particles may be come into existence in a matrix resin by phase separation that will be described later. The amorphous fine particles may be formed by a photolithographic manner and coated a transparent resin thereonto.

The inorganic substance fine particles are, for example, spherical amorphous fine particles including an oxide, such as silica or alumina. Examples of the organic polymer fine particles include acrylic fine particles or styrene-acrylic fine particles, and crosslinked bodies thereof; melamine fine particles; fine particles of a melamine-formalin condensed product; fine particles of a fluorine-containing polymer such as (polytetrafluoroethylene), PFA (perfluoroalkoxy resin), FEP (tetrafluoroethylene-hexafluoropropylene copolymer), PVDF (polyfluorovinylidene) or ETFE (ethylene-tetrafluoroethylene copolymer); and silicone resin fine particles. Of these examples, particularly preferred are crosslinked acrylic resin fine particles, which have a refractive index less than 1.5, and silica particles or silicone resin fine particles, which have a refractive index of 1.42 to 1.45 (halogen lamp D line, 589 nm) since the refractive indexes thereof are small.

In the case of, for example, crosslinked acrylic fine particles, the refractive index of which is 1.49 (value measured by use of a halogen lamp D line, 589 nm), the refractive index of the matrix resin is preferably from 1.55 to 1.65. In the case of silica particles or silicone resin fine particles, the refractive index of which is from 1.42 to 1.45, the refractive index of the matrix resin is preferably from 1.50 to 1.60. These fine particles need only to be mainly contained as fine particles in the light scattering layer. For example, it is advisable that these fine particles are contained in a proportion of about 70% or more of fine particles. It is allowable to add, besides these fine particles, non-spherical fine particles such as indeterminate-form fine particles, or crystalline fine particles in a small proportion of about 30% or less in order to fine tuning a dispersion stability of the fine particles in coating liquid or a fine adjustment of a light scattering property thereof.

The shape of the amorphous fine particles is not particularly limited, and may be a sphere or a shape similar to a sphere. Since the spherical fine particles are easily controlled about the size, the particle diameter distribution and other properties thereof, optical properties of the light scattering layer can easily be controlled. About the particle diameter of the fine particles, a permissible range thereof is varied in accordance with a target film thickness of the light scattering layer, or a matter as to whether or not the layer is colored; thus, the particle diameter is not particularly limited. Usually, however, if fine particles having a size larger than the film thickness of the light scattering layer are used, the front surface of the light scattering layer becomes coarse, which is not favorable very much. The particle diameter of the fine particles is not particularly limited. In connection with a preferred range of the particle diameter, the average particle diameter thereof is from about 0.8 to 3 μm, preferably from 1 to 2 μm.

The matrix resin, wherein the fine particles are to be dispersed, is desirably a resin which is high in visible ray transmittance and resistant sufficiently against thermal treatment or chemical treatment in the process of producing the liquid crystal display device. For example, epoxy-modified acrylic resin, florene resin or polyimide resin, may be used as a resin having the high refractive index, and fluorine-modified acrylic resin or silicon-modified acrylic resin may be used as a resin having the low refractive index. The matrix resin may be appropriately used from other acrylic resins, epoxy resin, polyester resin, urethane resin, and silicone resin.

The amorphous fine particles in the light scattering layer may be, for example, fine particles formable by mixing two resins with each other and subjecting the mixture to phase separation. The amorphous fine particles may be formed by selecting two or more resins different from each other in refractive index, and additive materials in respective appropriate amounts, coating a coating solution wherein these components are dissolved in a solvent onto a substrate, and then drying the coated solution.

According to the phase separation, particles grow when the two resins are mixed in the solution, or in a process wherein the solution is coated above the substrate and then dried so that the solvent is volatilizing; and transparent amorphous fine particles can be formed when the coated film has been dried. At this time, one of the resins subjected to the phase separation is growing into a spherical form in the solution. However, when the solution is coated above the substrate, the film volume is decreasing and further the spheres are growing to increase in volume as the solvent in the coated film is volatilizing.

However, the particles are growing while the particles are deformed from the spherical form to a disc-form by stress from the upper surfaces of the particles.

Conditions for causing, from solutions of two resins, one thereof to be generated and grown in the form of droplets, and forming amorphous fine particles are as follows when the one resin is represented by A and the other resin is represented by B:

1) A is smaller in amount than B,
2) the solution of A is larger in surface tension than that of B,
3) the solution of A is larger in evaporation rate than that of B, and
4) A is larger in molecular weight than B.

In particular, the largeness/smallness relationship about the A and B amounts is a condition restricting strength.

When amorphous fine particles are generated and formed from two or more resin solutions different from each other in refractive index by the phase separation, the amorphous fine particles remain inside a membrane without appearing into the front surface. Thus, the front surface of the light scattering layer becomes flat, and further the film thickness of the color filter also becomes even.

When the amorphous fine particles are semispherical microlenses formed by melting a fine resin pattern, the light scattering property can be adjusted by changing a pattern form (a size, shape or density). Alternatively, a light scattering layer having a directivity can be formed by making respective sectional shapes of the microlenses into an asymmetric or parabolic form.

When the light scattering layer is formed to a pattern form through a photolithographic process, an acrylic resin or epoxy resin having photosensitivity and developability may be used. Thermal curability or ultraviolet curability may be given to these resins so that the resins may be used together.

When the cell gap adjusting layer is rendered a light scattering layer, it is desired that the size of the pattern of the light scattering layer is made equal to the size of the retardation layer when this layer is viewed in plan, or larger than the size of the retardation layer.

(¼-Wavelength layer)

In addition to an optical path difference, a difference in retardation depending on the liquid crystals is generated between the reflection region of the transflective type liquid crystal display device and the transmission region. By such a difference in retardation between the reflection region and the transmission region, coloration may be generated in reflected light onto the reflection region, or black display, a contrast may be lowered, or a display that should be a normally black display may be turned to a normally white display. Thus, problems about the retardation are serious.

Against the problems, by shifting incident light by a ¼-wavelength retardation thereof, and further adding a ¼-wavelength retardation thereto by reflection on the reflection electrode, the problems can be solved (incident light converted to linearly polarized light is reciprocated once along the thickness direction of the retardation layer, thereby being rotated and polarized at 90 degrees).

Specific examples of a method for supplying a function of changing a ¼-wavelength phase to the retardation layer in the transflective type liquid crystal display device include a coating formation method using a polymeric liquid crystal or crosslinking polymeric liquid crystal solution; a form method of adding a birefringence adjustor to the above-mentioned alkali-soluble transparent resin; and a method using a polymerizable liquid crystal compound. In the case of the polymerizable liquid crystal compound, use may be made of a discotic polymerizable compound having a disc-form molecular structure or a rod-like polymerizable liquid crystal compound. The retardation layer may be formed by combining two or more of these described methods and/or materials.

In order to heighten a reproducibility of a supply of a function of changing polarized light by a ¼-wavelength phase, an aligned film may be formed or an alignment treatment may be conducted before a formation of the retardation layer. When alignment adjusting can be executed by an exposure value or a wavelength of light exposure, as a polymerizable liquid crystal compound, an alignment density or alignment direction thereof can be adjusted by a color of the color pixel. The alignment treatment for the aligned film may also be the same optical alignment treatment as used for the polymerizable liquid crystal compound.

In the exposure apparatus, an ultrahigh-pressure mercury lamp, a YAG laser, a solid laser, a semiconductor laser or others are appropriately selected in addition to an exposure wavelength. In the case of a laser exposure, the alignment density and the alignment direction can be adjusted, for example, by selecting the light exposure wavelength, adjusting the exposure value dependently on the number of times of a laser shot, or an incidence angle of the laser ray. Using plural photomasks, selective exposure may be conducted for each of the color pixels. Respective radiations from plural directions may be conducted at a time. The exposure may be conducted by polarized-light radiation or non-polarized-light radiation. It is allowable to conduct polarized-light radiation, and subsequently fixing the alignment by non-polarized-light radiation while warming. When oxygen hindrance is caused, it is desired to conduct the exposure in an inert gas atmosphere.

It is advisable to adjust the film thickness of the retardation layer into the range of about 0.5 to 5 μm to match with constituting materials of the color filter, or the thickness of the liquid crystal layer used in the liquid crystal display device, or the birefringence of the liquid crystals used therein. The value of the retardation of the retardation layer can be adjusted by the exposure value, the addition amount or kind of a polymerization initiator added to the polymerizable liquid crystal compound, or blending. When the polymerizable liquid crystal compound is a monomer, the crosslinkage density thereof can be raised by introducing plural reactive groups to the monomer, so that a highly reliable retardation layer can be formed.

When a polymerizable liquid crystal compound is used for the retardation layer, it is allowable to form an aligned film in a printing manner, for pre-treatment, before the formation of the retardation layer, and conduct an alignment treatment. It is desired to form the retardation layer to produce a color filter substrate, and subsequently form an aligned film for the alignment of the liquid crystals. When this aligned film is an aligned film capable of adjusting an alignment quantity by energy rays, such as ultraviolet rays, the alignment quantity can be varied between the transmission region and the reflection region, or alignment can varied between the individual colors by a laser exposure as described above. Alternatively, the aligned film used for the alignment treatment of the retardation layer can be used for the alignment of the liquid crystals in the transmission region, and a film having a different alignment function can be separately formed for the retardation layer in the reflection region.

Examples of an organic compound usable in the aligned film that is to be an underlying layer of the retardation layer include polymers such as polymethyl methacrylate, acrylic acid-methacrylic acid copolymer, styrene-maleimide copolymer, polyvinyl alcohol, poly(N-methylolacrylamide), styrene-vinyltoluene copolymer, chlorosulfonated polyethylene, nitrocellulose, polyvinyl chloride, chlorinated polyolefin, polyester, polyimide, polyamide, polyvinyl alcohol, vinyl acetate-vinyl chloride copolymer, ethylene-vinyl acetate copolymer, carboxymethylcellulose, polyethylene, polypropylene, and polycarbonate; and other compounds such as a silane coupling agent. Preferred examples of the polymers include polyimide, polystyrene, polymers made from any styrene derivative, gelatin, polyvinyl alcohol, and alkyl-modified polyvinyl alcohol having an alkyl group (preferably having 6 or more carbon atoms).

An alignment effect can be obtained also by rubbing the front surface of the color pixel of the color filter, which is to be an underlying layer of the ¼-wavelength layer. Furthermore, a commercially available aligned film material can be used. Examples thereof include an aligned film material (SANEVER) manufactured by Nissan Chemical Industries, Ltd., aligned film materials (QL, and LX series) manufactured by HD MicroSystems, Ltd., aligned film materials (AL series) manufactured by JSR Corp., and an aligning agent (LIXSON ALIGNER) manufactured by Chisso Corp. When these aligned film materials are each adjusted about the viscosity thereof in order to be used as an inkjet ink, the adjustment can be attained by the addition of an organic solvent such as γ-butyrolactone, diethylene glycol monoethyl acetate, diethylene glycol monobutyl acetate, or cyclohexanone.

For the alignment treatment of the aligned film that is to be the underlying layer of the retardation layer, adoptable is the same method as used for the alignment of the aligned film for the liquid crystals used for the liquid crystal display device. The method may be, for example, a rubbing method, wherein the front surface of the aligned film is mechanically rubbed, or an optical alignment method using ultraviolet rays. A light source for the ultraviolet rays may be, for example, an ultrahigh-pressure mercury lamp, a low-pressure mercury lamp, a short arc type xenon lamp, a solid laser, a YAG laser, or a semiconductor laser, and the wavelength, the radiation angle, and radiation value and others of the ultraviolet rays to be radiated may be appropriately selected. Adoptable is a method of radiating the ultraviolet rays from plural directions, such as two directions or four directions.

In Examples, which will be described later, a description will be made about examples in each of which a pattern of an aligned film is formed in an inkjet manner, which is the simplest manner. However, such a pattern may be formed in a photolithographic manner using a developable, photosensitive aligned film material.

An area ratio between the transmission regions and the reflection regions of the substrate according to this embodiment can be adjusted in accordance with the use purpose/conditions of the liquid crystal display device.

(Dielectric Constant)

The dielectric constant referred to in the present specification has a prerequisite condition that the dielectric constant is measured at room temperature and at a frequency of 50 to 500 Hz, which is used to drive liquid crystal. When the liquid crystal driving frequency is more than 500 Hz, it is desired to measure an electric property of a member at the frequency, which is to be used.

(Array Substrate, and First and Second Electrodes)

The respective materials of the first and second electrodes of the array substrate side of the liquid crystal display device may each be an electroconductive metal oxide as described above, such as ITO. A metal better in electroconductivity than a metal oxide may be used. When the liquid crystal display device is of a reflection type or transflective type, a thin film of aluminum or an aluminum alloy may be used for either one of the first and second electrodes. Alternatively, a metal thin film usable for, e.g., a gate interconnect of a TFT may be formed as a light reflecting film for an electrically independent pattern.

As will be described later, the first and second electrodes are electrically insulated from each other through an insulating layer in the thickness direction. The respective thicknesses of the color layer, the resin layer and the insulating layer may be adjusted in accordance with the thickness and the dielectric constant of the liquid crystal layer, an applied voltage, and a driving condition. When the insulating layer is formed by SiN, the film thickness of the insulating layer is practically from 0.1 to 0.5 μm. The formed positions of the first and second electrodes in the film thickness direction may be positions reverse to each other.

In this embodiment, the oblique electric field can be more effectively used. Thus, the range over which electric lines of force are extended at the time of the drive-voltage applying is spread in the thickness direction of films including the liquid crystal layer and the resin layer, so that the transmittance can be increased.

Figure 2:
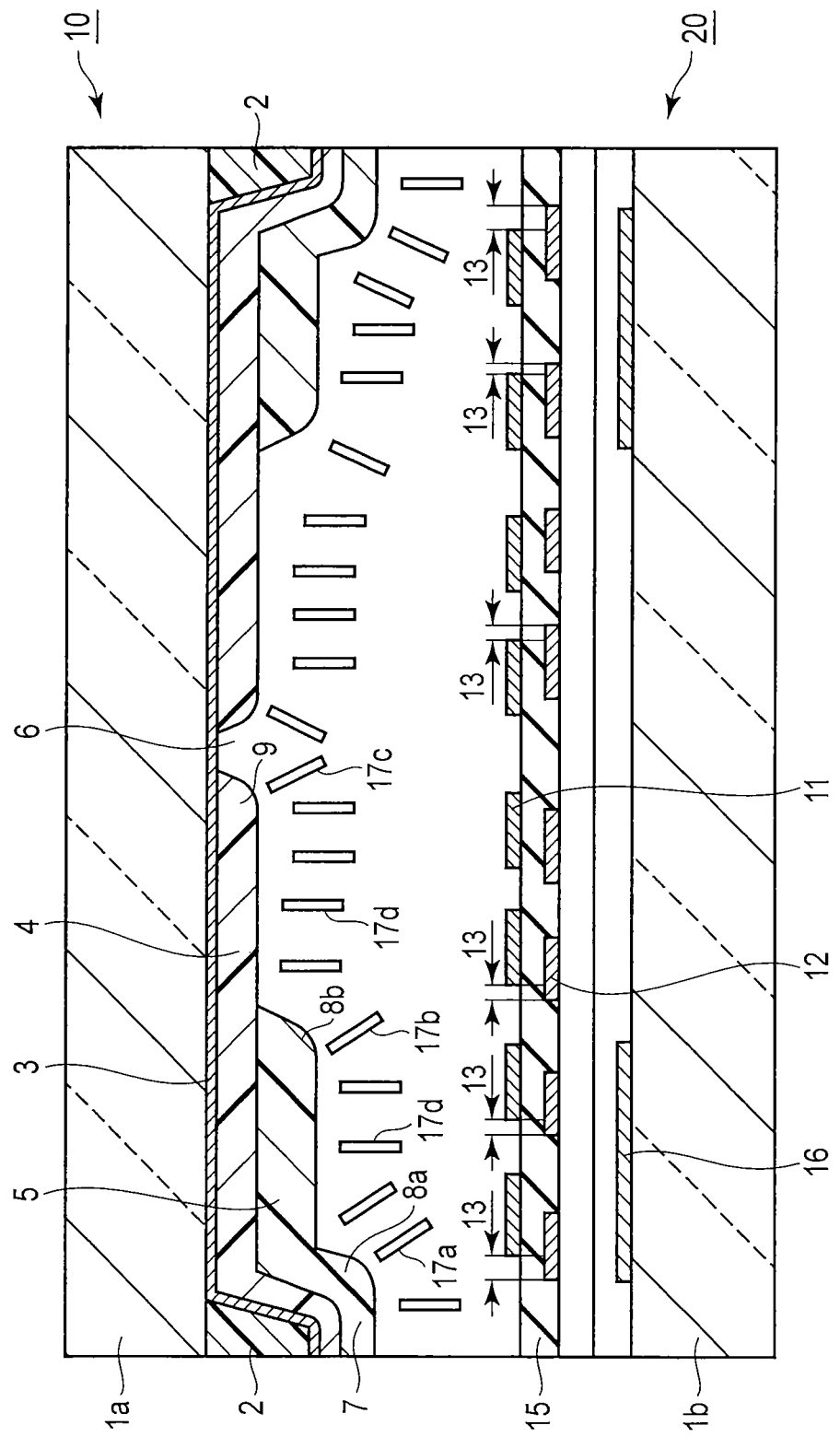
FIG. 2 is a sectional view illustrating a liquid crystal display device according to a second embodiment of the invention.

With reference to FIG. 2, the following will detail a liquid crystal display device using liquid crystals having a negative dielectric constant anisotropy according to a second embodiment of the invention.

FIG. 2 is a schematic sectional view of the liquid crystal display device, wherein liquid crystals 17 are sandwiched between the BM substrate 10 illustrated in FIG. 1 and an array substrate 20. In the figure, reference number 1b represents a transparent substrate. Omitted is illustration of a color filter, protective layer and aligned film above the color filter, polarizing plate, and retardation plate, and others. The polarizing plate is in a crossed Nichol form, and the liquid crystal display device is a normally black liquid crystal display device. The polarizing plate may be a polarizing plate yielded by drawing a polyvinyl alcohol based organic polymer containing iodine, and having an absorption axis in the drawn direction by the drawing.

Hereinafter, motions of liquid crystal molecules 30 in the transmission region T will be described as a typical example. However, electrodes of the reflection region R can be interpreted by substituting the electrodes of the reflection region R with first electrodes 11 of the reflection region and second electrodes 12 of the reflection region.

FIG. 2 illustrates an alignment state of liquid crystal molecules 17a, 17b, 17c and 17d in the liquid crystals aligned vertically in a state that no voltage is applied to a third electrode 3 which is a transparent electroconductive film, and the first electrodes 11 and the second electrodes 12. The liquid crystal molecule 17d is aligned perpendicularly to the substrate plane by the vertically aligned film. The liquid crystal 17a near a shoulder portion 8a of a convex region 7, the liquid crystal 17b near a shoulder portion 8b of a cell gap adjusting layer 5, and the liquid crystal 17c near a shoulder portion 7 of a concave region 8 are somewhat obliquely aligned in the state that no voltage is applied thereto. The formation of the convex region 7 and the concave region 6 causes the liquid crystal molecules 17a, 17b and 17c to be substantially tilted without rubbing or any other alignment treatment. When a voltage for driving the liquid crystals is applied in this obliquely-aligned state, the liquid crystal molecules 17a, 17b and 17c are inclined into directions of respective arrows, as illustrated in FIG. 3.

In this embodiment, both of the liquid crystals having a negative dielectric constant anisotropy, and liquid crystals having a positive dielectric constant anisotropy may be used. As the liquid crystal having the negative anisotropy, use may be made of, for example, a nematic liquid crystal having a birefringence Δn of about 0.1 at room temperature or thereabout. About the liquid crystal having the positive anisotropy, the scope of species to be selected is wide; thus, various liquid crystal materials may be used. The thickness of the liquid crystal layer does not need to be particularly limited. The Δnd of a liquid crystal layer usable effectively in this embodiment ranges from about 300 to 500 nm. The aligned film, which is not illustrated, may be, for example, a film obtained by heating and hardening a polyimide based organic polymer film. One to three retardation plates may be used in such a form that the plate(s) is/are laminated to one or more of the polarizing plates.

Figure 3:
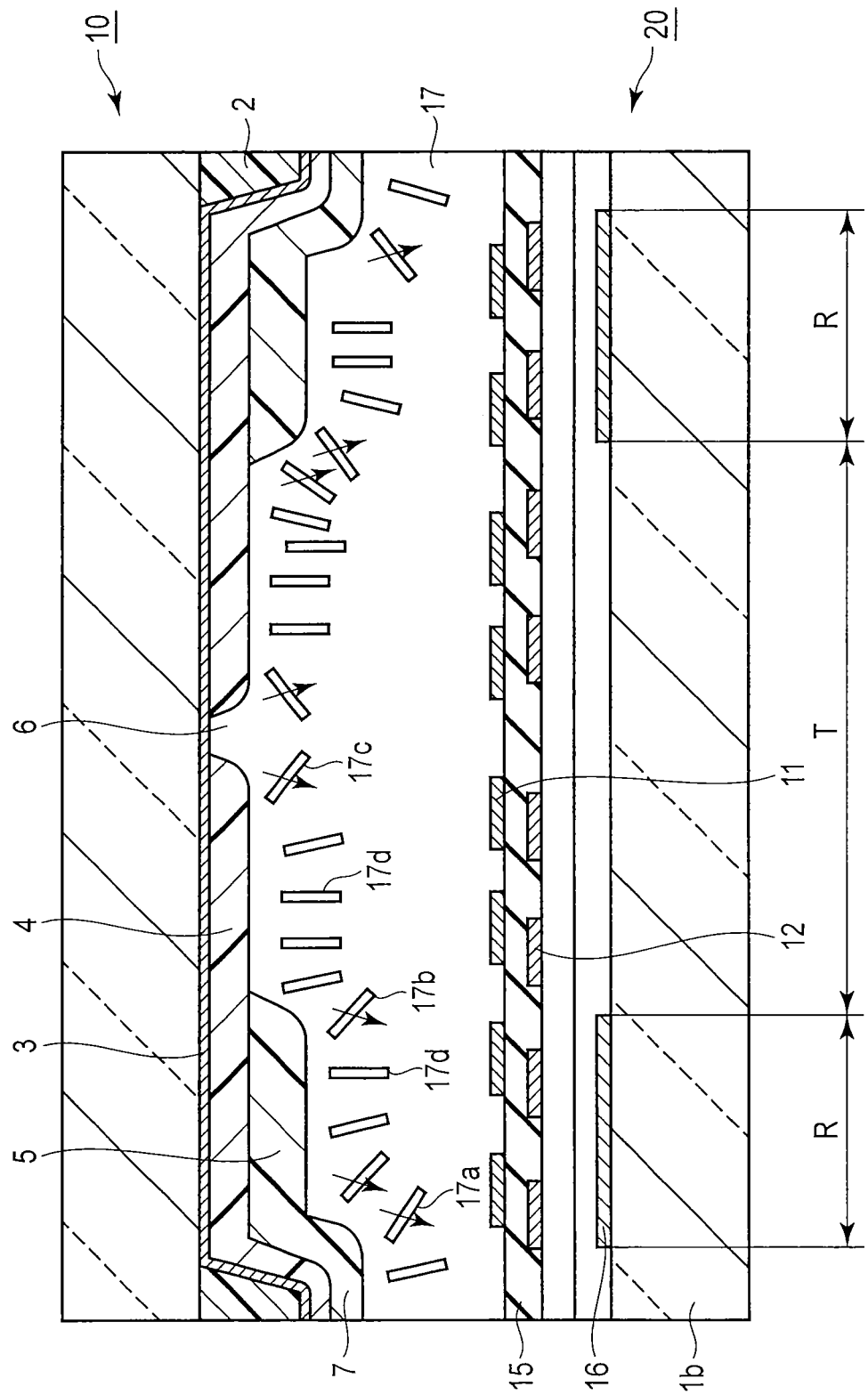
FIG. 3 is a view demonstrating motions of liquid crystals above a liquid crystal display device substrate in the liquid crystal display device according to the second embodiment of the invention.

As illustrated in FIG. 3 or 11, the first electrodes 11 and the second electrodes 12 are formed on different layers via an insulating layer 15 or 55 made of SiN, $SiO_2$ or some other. External light come within the reflection region R is reflected on a reflecting film 16 or 53 that is an aluminum alloy thin film.

In the embodiment, the motions that the liquid crystals are inclined means, when the liquid crystals have a negative dielectric constant anisotropy, motions that the liquid crystals having the initially vertical alignment, are rotated into a horizontal direction at the time of drive-voltage applying. The motions means, when the liquid crystals have a positive dielectric constant anisotropy, motions that the liquid crystals having the initially horizontal alignment, are rotated into a vertical direction at the time of drive-voltage applying.

FIG. 3 is a schematic sectional view demonstrating motions of the liquid crystal molecules which begin to be inclined just after the drive-voltage applying. With the voltage applying, first, the liquid crystal molecules 17a, 17b and 17c begin to be inclined, and subsequently liquid crystal molecules around these liquid crystal molecules are gradually inclined. In the convex region 7 and the concave region 6, the resin layer 4 which is a dielectric body, is thin or absent, or the distance between the third electrode 3 and the first electrodes 11 is small; therefore, the applied drive-voltage is easily transmitted to the liquid crystal molecules. Thus, these regions function as strong triggers for the motions that the liquid crystals are inclined.

In respective ½ pixels at the right and left of FIG. 3, the directions in which the liquid crystals are inclined are directions reverse to each other. Thus, an optical compensation in a half-tone display can be attained dependently only on a value of the drive-voltage. As a result, a wide viewing angle can be ensured without forming four multi-domains as in an MVA liquid crystal. In a half-tone (for example, the individual liquid crystal molecules are in a state of being oblique), one of the ½-pixels in FIG. 3 and the opposite-side other ½-pixel come to have liquid crystal alignments having inclination gradients which are reverse to each other, so that transmitted light is averaged by these two ½-pixels. Thus, the viewing angle can be widened.

Figure 4:
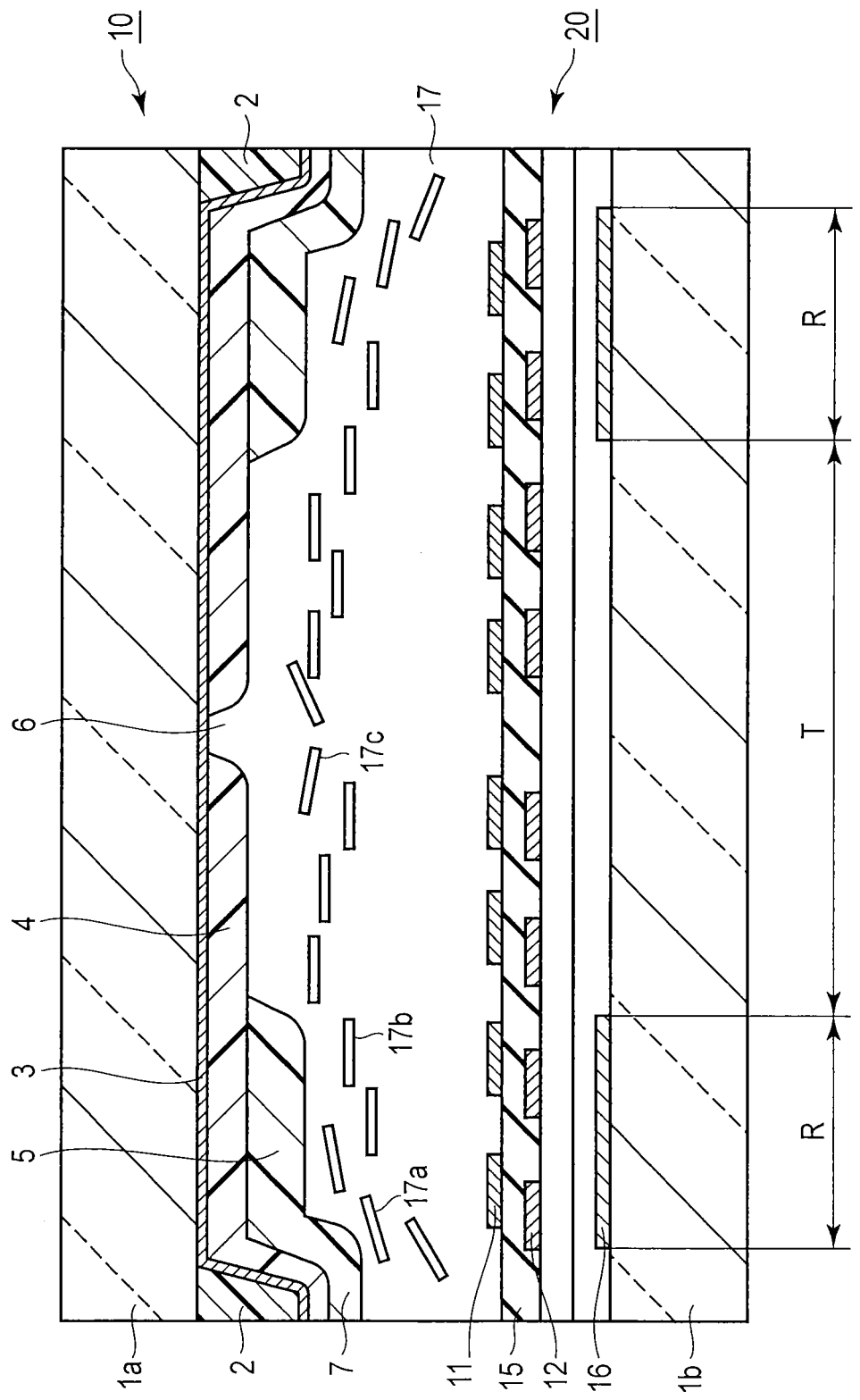
FIG. 4 is a view demonstrating an alignment state of liquid crystal molecules above the liquid crystal display device substrate in the liquid crystal display device according to the second embodiment of the invention when a stable white display is made after drive-voltage applying.

FIG. 4 is a view illustrating an aligned state of the liquid crystal molecules when a stable white display is attained after the drive-voltage applying. The liquid crystal molecules are aligned in substantially parallel to the substrate plane while slightly inclined.

The above has described a behavior of the liquid crystal molecules near the BM substrate side according to this embodiment. However, about a liquid crystal display device according to a different embodiment of the invention, a technique that at the array substrate side also, liquid crystal molecules are caused to be inclined in a direction identical with the direction of the liquid crystal motions shown at the above-mentioned BM substrate side, is suggested. Hereinafter, such a technique will be described about a case of liquid crystals having a negative dielectric constant anisotropy.

Figure 5:
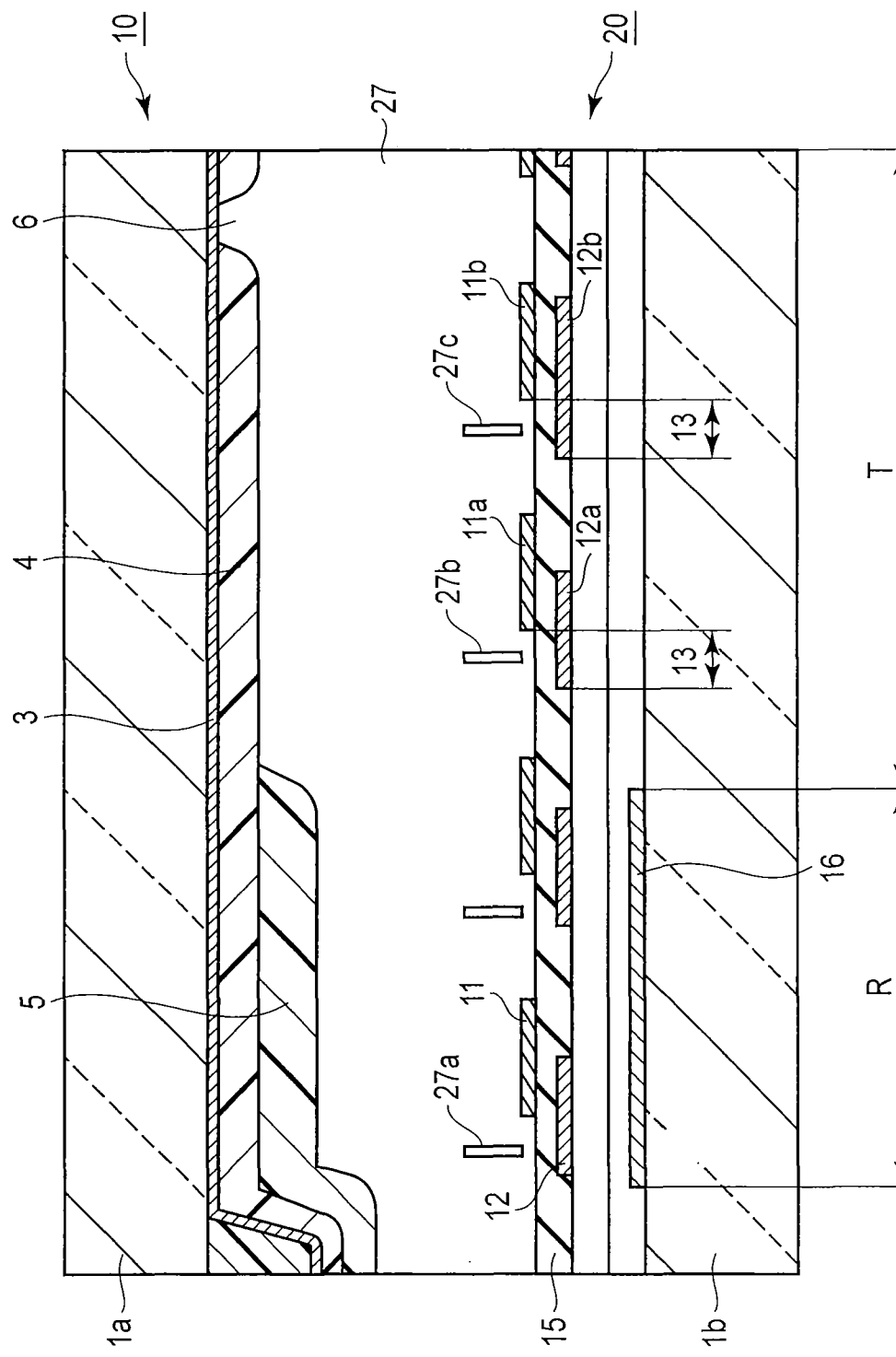
FIG. 5 is a view demonstrating motions of liquid crystals above an array substrate of a liquid crystal display device according to another embodiment of the invention.

FIG. 5 illustrates first electrode 11a and 11b that have a comb-teeth-form pattern; second electrode 12a and 12b that have a comb-teeth-form pattern equivalent to the first electrode 11a and 11b; and vertically aligned liquid crystal molecules 27a, 27b, and 27c near the first electrode 11a and 11b. The second electrode 12a is protruded to a direction toward a black matrix 2, which is a direction in which the liquid crystal 27a is inclined. The quantity of this protrusion, which is a protrusion 13, can be adjusted into various values by a liquid crystal material to be used, the drive-voltage, dimensions of the thickness of the liquid crystal cell, and others. The quantity of the protrusion 13 is sufficient even when the quantity is a small quantity of 1 to 6 µm. Illustration of the aligned film is omitted.

Figure 6:
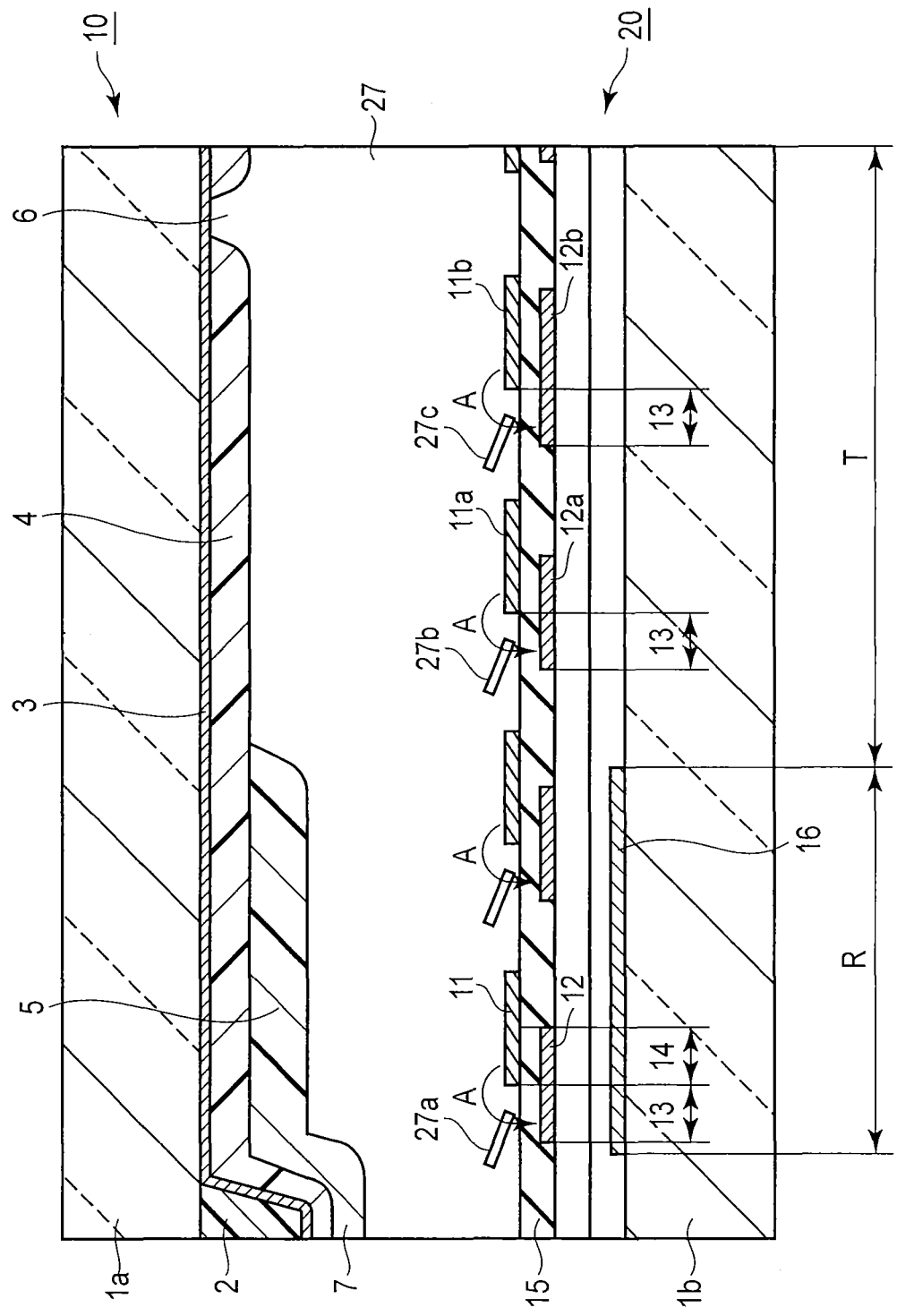
FIG. 6 is a view demonstrating motions of liquid crystals above an array substrate of a liquid crystal display device according to another embodiment of the invention.

In FIG. 6 are shown respective motions of the liquid crystal molecules 27a, 27b, 27c and 27d together with lines 26a, 26b and 26c of electric force just after the liquid-crystal-drive-voltage applying. By the voltage applying, the liquid crystal molecules 27a, 27b, 27c and 27d begin to be inclined into respective directions A of the electric force lines. These directions, in which the liquid crystal molecules are inclined, are identical with the directions in which the liquid crystal molecules 17a, 17b and 17c illustrated in FIG. 3 are inclined; therefore, illustrated liquid crystal molecules are instantaneously inclined in the same direction, so that the responsibility of the liquid crystals can be largely improved.

FIG. 6 shows a ½ pixel of the rectangular pixel. The direction of a protrusion in the other ½ pixel is linearly symmetrical, and is a reverse direction in the same state as illustrated in FIG. 5. The pattern of each of the comb-teeth-form electrodes may have a V shape, or an oblique direction when viewed in plan. Alternatively, the comb-teeth-form patterns have directions which are varied by 90° in the unit of a ¼ pixel. Such a comb-teeth-form pattern of each of the electrodes is desirably centrosymmetrical or linearly symmetrical to a central point or line of each of the rectangular pixels.

When each of the pixels is a longitudinal rectangular pixel, the form of the concave region 6 when viewed in plan is preferably a straightly linear form at the center of the rectangular pixel to divide the rectangular pixel into two parts. The concave region 6 may be made into a cross-form or X-form from the center of the rectangular pixel in accordance with the comb-teeth-pattern form of the first electrode or second electrode. When the concave region is made in the cross-form or X-form, the protrusion of the second electrode is desirably arranged into a direction toward one of the four sides of the rectangular pixel (the black matrix) from the first electrode region (opposed thereto). The comb-teeth pattern of each of the first and second electrodes is desirably centrosymmetrical or linearly symmetrical to the center of the rectangular pixel. When the liquid crystals are driven in the state that the pixel is divided, optical compensation can be completely attained to supply a vertically aligned liquid crystal display device giving a wide viewing angle, and bringing no color change even when its screen is viewed along any angle thereto.

A voltage for driving the liquid crystal is applied to the first electrode 11; however, the second electrode 12, and the third electrode 3 can be made into a common potential. An overlap portion 14 of each of the first electrode 11 and the second electrode region 12 can be used as an auxiliary capacitor.

In order to heighten the directivity of the liquid crystal molecules above the projection of the second electrode 12 when the molecules are inclined, the following methods may be used:

1) the edge of the first electrode 11 is tapered,
2) the film thickness of the first electrode 11 is made large, and
3) a part of the insulating layer below the first electrode 11 is partially etched, so that the insulating layer above the second electrode 12 is made thin.

When a small pre-tilt angle, for example, an angle of 0.1 to 1' is given to the liquid crystal molecules, the initial alignment of which is vertical, in this way, the direction in which the liquid crystal molecules are inclined can be decided so that the liquid crystal molecules are easily inclined even at a low voltage. Thus, an enhancement of responsibility and an improvement of low-level-gradation display are attained.

When a channel material of a TFT that is an active element included in the liquid crystal display device is, for example, an oxide semiconductor, the aperture rate of the pixel can be improved. A typical example of the oxide semiconductor is multiple metal oxide including indium, gallium and zinc, which is called IGZO.

The material of the liquid crystal may be a liquid crystal material having, in the molecular structure thereof, a fluorine atom (fluorine-containing liquid crystal). At the time of the liquid-crystal-drive-voltage applying, a strong electric field is substantially generated in the protrusion of the second electrode from the first electrode so that the liquid crystal can be driven by use of a liquid crystal material lower in dielectric constant (or small in dielectric constant anisotropy) than conventional liquid crystal materials used for vertical alignment. A liquid crystal material small in dielectric constant anisotropy is generally low in viscosity. Thus, a falling time when the drive-voltage is switched off can be made short. Moreover, the fluorine-containing liquid crystal takes in only a small amount of ionic impurities since the fluorine-containing liquid crystal is low in dielectric constant, so that small is also a deterioration based on the impurities in the voltage retention rate and other performances thereof. Thus, the liquid crystal has an advantage of not causing a display unevenness or baking easily.

Hereinafter, a description will be made about various materials used in the liquid crystal display device substrates according to the various embodiments of the invention.

(Transparent Resin)

A photosensitive colored composition used to form the light-shielding layer (black matrix) or the color layer further contains a polyfunctional monomer, a photosensitive or non-photosensitive resin, a polymerization initiator, a solvent and/or others besides the above-mentioned pigment dispersed product. Any organic resin high in transparency and usable in this embodiment, such as a photosensitive or non-photosensitive resin, is generically named a transparent resin.

Examples of the transparent resin include a thermoplastic resin, a thermosetting resin, and a photosensitive resin. Examples of the thermoplastic resin include butyral resin, styrene-maleic acid copolymer, chlorinated polyethylene, chlorinated polypropylene, polyvinyl chloride, vinyl chloride-vinyl acetate copolymer, polyvinyl acetate, polyurethane resin, polyester resin, acrylic resin, alkyd resin, polystyrene resin, polyamide resin, rubbery resin, cyclized rubbery resin, celluloses, polybutadiene, polyethylene, polypropylene, and polyimide resin.

Examples of the thermosetting resin include epoxy resin, benzoguanamine resin, rosin-modified maleic acid resin, rosin-modified fumaric acid resin, melamine resin, urea resin, and phenolic resin. The thermosetting resin may be a product obtained by causing a melamine resin that will be described later to react with a compound containing an isocyanate group.

(Alkali-Soluble Resin)

For the light-shielding layer, the light scattering layer, the color layer, and the cell gap adjusting layer used in this embodiment, it is preferred to use a photosensitive resin composition that can be patterned by photolithography. The above-described transparent resins are each desirably a resin to which alkali solubility is given. The alkali-soluble resin is not particularly limited as far as the resin is a resin containing a carboxyl group or hydroxyl group. Examples thereof include epoxy acrylate resin, novolak resin, polyvinylphenolic resin, acrylic resin, carboxyl-group-containing epoxy resin, and carboxyl-group-containing urethane resin. Of these examples, preferred are epoxy acrylate resin, novolak resin and acrylic resin, and particularly preferred are epoxy acrylate resin and novolak resin.

(Acrylic Resin)

Typical examples of the transparent resin adoptable in this embodiment are acrylic resins that are each a polymer obtained by using, as a monomer, for example, the following: (meth)acrylic acid; an alkyl (meth)acrylate such as methyl (meth)acrylate, ethyl (meth)acrylate, propyl (meth)acrylate, butyl (meth)acrylate, t-butyl (meth)acrylate penzyl (meth) acrylate, or lauryl (meth)acrylate; a hydroxyl-group-containing (meth)acrylate such as hydroxylethyl (meth)acrylate, or hydroxylpropyl (meth)acrylate; an ether-group-containing (meth)acrylate such as ethoxyethyl (meth)acrylate, or glycidyl (meth)acrylate; or an alicyclic (meth)acrylate such as cyclohexyl (meth)acrylate, isobornyl (meth)acrylate or dicyclopentenyl (meth)acrylate.

The above-mentioned monomers may be used alone or in combination of two or more thereof. The transparent resin may be a copolymer made from the monomer(s) and a compound copolymerized therewith, such as styrene, cyclohexylmaleimide, or phenylmaleimide.

Moreover, the (above-mentioned) photosensitive resin can be yielded by copolymerizing a carboxylic acid having an ethylenically unsaturated group, such as (meth)acrylic acid, with some other monomer, and then causing the resultant copolymer to react with a compound having an epoxy group and an unsaturated double bond, such as glycidyl methacrylate, or by adding a carboxylic-acid-containing compound such as (meth)acrylic acid to a polymer made from an epoxy-group-containing (meth)acrylate, such as glycidyl methacrylate, or to a copolymer made from this polymer and a different (meth)acrylate.

Furthermore, the photosensitive resin can also be yielded by causing a hydroxyl-group-containing polymer made from a monomer such as hydroxyethyl methacrylate to react with a compound having an isocyanate group and an ethylenically unsaturated group, such as methacryloyloxyethyl isocyanate.

As above-mentioned, carboxyl-group-containing resin can be yielded by causing a copolymer made from hydroxyethyl methacrylate having plural hydroxyl groups, and some other monomer to react with a polybasic acid anhydride to introduce carboxyl groups to the copolymer. The method for producing the carboxyl-group-containing resin is not limited to only this method.

Examples of the acid anhydride used in this reaction include maloic anhydride, succinic anhydride, maleic anhydride, itaconic anhydride, phthalic anhydride, tetrahydrophthalic anhydride, hexahydrophthalic anhydride, methyltetrahydrophthalic anhydride, and trimellitic anhydride.

The acid value of the solid content in each of the above-mentioned acrylic resins is preferably from 20 to 180 mgKOH/g. If the acid value is less than 20 mgKOH/g, the photosensitive resin composition is too small in developable rate so that a period required for the development thereof becomes long. As a result, the substrate made from the composition tends to be poor in productivity. If the acid value in the solid content is larger than 180 mgKOH/g, the composition is reversely too large in developable rate. Thus, an inconvenience that after the development the pattern is peeled or chipped tends to be caused.

When the above-mentioned acrylic resins each have photosensitivity, the double bond equivalent of the acrylic resin is preferably 100 or more, more preferably from 100 to 2000, most preferably from 100 to 1000. If the double bond equivalent is more than 2000, the resin composition may not gain a sufficient photo-curability.

(Photopolymerizable Monomer)

Examples of the photopolymerizable monomer include various acrylates and methacrylates such as 2-hydroxyethyl (meth)acrylate, 2-hydroxypropyl (meth)acrylate, cyclohexyl (meth)acrylate, polyethylene glycol di(meth)acrylate, pentaerythritol tri(meth)acrylate, trimethylolpropane tri(meth)acrylate, dipentaerythritol hexa(meth)acrylate, tricyclodecanyl (meth)acrylate, melamine (meth)acrylate and epoxy (meth)acrylate; (meth)acrylic acid, styrene, vinyl acetate, (meth) acrylamide, N-hydroxymethyl(meth)acrylamide, and acrylonitrile.

It is also preferred to use a polyfunctional urethane acrylate having a (meth)acryloyl group, which is yielded by causing a polyfunctional isocyanate to react with a (meth)acrylate having a hydroxyl group. The combination of the (meth)acrylate having a hydroxyl group with the polyfunctional isocyanate is any combination, and is not particularly limited. About the polyfunctional urethane isocyanate, a single species thereof may be used alone, or two or more species thereof may be used in combination.

(Photopolymerization Initiator)

Examples of the photopolymerization initiator include acetophenone compounds such as 4-phenoxydichloroacetophenone, 4-t-butyl-dichloroacetophenone, diethoxyacetophenone, 1-(4-isopropylphenyl)-2-hydroxy-2-methylpropane-1-one, 1-hydroxycyclohexyl phenyl ketone, and 2-benzyl-2-dimethylamino-1-(4-morpholinophenyl)-butane-1-one; benzoin compounds such as benzoin, benzoin methyl ether, benzoin ethyl ether, benzoin isopropyl ether, and benzyl dimethyl ketal; benzophenone compounds such as benzophenone, benzoylbenzoic acid, methyl benzoylbenzoate, 4-phenylbenzophenone, hydroxybenzophenone, acrylated benzophenone, and 4-benzoyl-4'-methyldiphenylsulfide; thioxanthone compounds such as thioxanthone, 2-chlorothioxanthone, 2-methylthioxanthone, isopropylthioxanthone, and 2,4-diisopropylthioxanthone; triazine compounds such as 2,4,6-trichloro-s-triazine, 2-phenyl-4,6-bis (trichloromethyl)-s-triazine, 2-(p-methoxyphenyl)-4,6-bis (trichloromethyl)-s-triazine, 2-(p-tolyl)-4,6-bis (trichloromethyl)-s-triazine, 2-pipenyl-4,6-bis (chloromethyl)-s-triazine, 2,4-bis(trichloromethyl)-6-styryl s-triazine, 2-(naphtho)-1-yl)-4,6-bis(chloromethyl)-s-triazine, 2-(4-methoxy-naphtho-1-yl)-4,6-bis(trichloromethyl)-s-triazine, 2,4-trichloromethyl-(piperonyl)-6-triazine, and 2,4-trichloromethyl(4'-methoxystyryl)-6-triazine; oxime ester compounds such as 1,2-octanedione, 1-[4-(phenylthio)-, 2-(O-benzyloxime)], and O-(acetyl)-N-(1-phenyl-2-oxo-2-(4'-methoxy-naphthyl)ethylidene)hydroxylamine; phosphine compounds such as bis(2,4,6-trimethylbenzoyl)phenylphosphine oxide, and 2,4,6-trimethylbenzoylphenylphosphine oxide; quinone compounds such as 9,10-phenanthrenequinone, camphorquinone, and ethylanthraquinone; borate compounds; carbazole compounds; imidazole compounds; and titanocene compounds. An oxime derivative (oxime compound) is effective for improving the resin composition in sensitivity. These may be used alone or in combination of two or more thereof.
(Photosensitizer)

It is preferred to use a photosensitizer together with the photopolymerization initiator. As the photosensitizer, the following may be used together: a-acyloxyester, acylphosphine oxide, methylphenyl glyoxylate, benzyl, 9,10-phenanthrenequinone, camphorquinone, ethylanthraquinone, 4,4'-diethylisophthalophenone, 3,3',4,4'-tetra(t-butylperoxycarbonyl) benzophenone, 4,4'-diethylaminobenzophenone, or some other compound.

The photosensitizer may be incorporated in an amount of 0.1 to 60 parts by mass for 100 parts by mass of the photopolymerization initiator.
(Ethylenically Unsaturated Compound)

It is preferred to use the photopolymerization initiator together with an ethylenically unsaturated compound. The ethylenically unsaturated compound means a compound having, in the molecule thereof, one or more ethylenically unsaturated bonds. Of such compounds, preferred is a compound having, in the molecule thereof, two or more ethylenically unsaturated bonds in order to improve the compound in polymerizability and crosslinkability, and enlarge a difference in developer-solubility between exposed portions and unexposed portions (of the composition), this difference being a difference following these two abilities. More preferred is a (meth)acrylate compound having an unsaturated bond originating from a (meth)acryloyloxy group.

Examples of the compound having, in the molecule thereof, one or more ethylenically unsaturated bonds include unsaturated carboxylic acids, such as (meth)acrylic acid, crotonic acid, isocrotonic acid, maleic acid, itaconic acid and citraconic acid, and alkyl esters thereof; (meth)acrylonitrile; (meth)acrylamide; and styrene. Typical examples of the compound having, in the molecule thereof, two or more ethylenically unsaturated bonds include esters each made from an unsaturated carboxylic acid and a polyhydroxy compound; (meth) acryloyloxy-group-containing phosphates; urethane (meth)acrylates each made from a hydroxyl(meth)acrylate compound and a polyisocyanate compound; and epoxy (meth)acrylates each made from (meth)acrylic acid or a hydroxyl(meth)acrylate compound, and a polyepoxy compound.

The above-mentioned photopolymerization initiator, photosensitizer, and ethylenically unsaturated compound may be added to a composition which contains a polymerizable liquid crystal compound and which is used to form a retardation layer that will be described later.
(Polyfunctional Thiol)

A polyfunctional thiol, which functions as a chain transfer agent, may be incorporated into the photosensitive colored composition. The polyfunctional thiol needs only to be a compound having two or more thiol groups. Examples thereof include hexanedithiol, decanedithiol, 1,4-butanediol bisthiopropionate, 1,4-butanediol bisthioglycolate, ethylene glycol bisthioglycolate, ethylene glycol bisthiopropionate, trimethylolpropane tristhioglycolate, trimethylolpropane tristhiopropionate, trimethylolpropane tris(3-mercaptobutyrate), pentaerythritol tetrakisthioglycolate, pentaerythritol tetrakisthiopropionate, tris(2-hydroxyethyl) trimercaptopropionate isocyanurate, 1,4-dimethylmercaptobenzene, 2,4,6-trimercapto-s-triazine, and 2-(N,N-dibutylamino)-4,6-dimercapto-s-triazine.

These polyfunctional thiol compounds may be used alone or in the form of a mixture of two or more thereof. The polyfunctional thiol may be used, in the photosensitive colored composition, in an amount ranging preferably from 0.2 to 150 parts by mass, more preferably from 0.2 to 100 parts by mass for 100 parts by mass of all species of pigment in the composition.
(Storage Stabilizer)

A storage stabilizer may be incorporated into the photosensitive colored composition to stabilize the composition about viscosity over time. Examples of the storage stabilizer include quaternary ammonium chlorides, such as benzyltrimethylchloride, and diethylhydroxyamine; organic acids, such as lactic acid and oxalic acid, and methyl ethers thereof; t-butylpyrocatechol; organic phosphines, such as triethylphosphine, and triphenylphosphine; and phosphites. The storage stabilizer may be incorporated into the photosensitive colored composition in an amount of 0.1 to 10 parts by mass for 100 parts by mass of the pigment therein.
(Tackifier)

A tackifier (adhesiveness improver), such as a silane coupling agent, may be incorporated into the photosensitive colored composition to make the composition high in adhesiveness to a substrate.

Examples of the silane coupling agent include vinylsilanes such as vinyltris(β-methoxyethoxy)silane, vinylethoxysilane, and vinyltrimethoxysilane; (meth)acrylsilanes such as γ-methacryloxypropyltrimethoxysilane; epoxysilanes such as β-(3,4-epoxycyclohexyl)ethyltrimethoxysilane, β-(3,4-epoxycyclohexyl)methyltrimethoxysilane, p-(3,4-epoxycyclohexyl)ethyltriethoxysilane, β-(3,4-epoxycyclohexyl)methyltriethoxysilane, γ-glycidoxypropyltrimethoxysilane, and γ-glycidoxypropyltriethoxysilane; aminosilanes such as N-β (aminoethyl)γ-aminopropyltrimethoxysilane, N-β(aminoethyl)γ-aminopropyltriethoxysilane, N-β(aminoethyl)γ-aminopropylmethyldiethoxysilane, γ-aminopropyltriethoxysilane, γ-aminopropyltrimethoxysilane, N-phenyl-γ-aminopropyltrimethoxysilane, and N-phenyl-γ-aminopropyltriethoxysilane; thiosilanes such as γ-mercaptopropyltrimethoxysilane, and γ-mercaptopropyltriethoxysilane. The silane coupling agent may be incorporated into the photosensitive colored composition in an amount of 0.01 to 100 parts by mass for 100 parts by mass of the pigment therein.
(Solvent)

A solvent such as water or an organic solvent may be blended with the photosensitive colored composition to make the composition coatable evenly onto a substrate. When the composition in the invention is for a color layer of a color filter, the solvent also has a function of dispersing a pigment evenly. Examples of the solvent include cyclohexanone, ethylcellosolve acetate, butylcellosolve acetate, 1-methoxy-2-propyl acetate, diethylene glycol dimethyl ether, ethylbenzene, ethylene glycol diethyl ether, xylene, ethylcellosolve, methyl-n amyl ketone, propylene glycol monomethyl ether, toluene, methyl ethyl ketone, ethyl acetate, methanol, ethanol, isopropyl alcohol, butanol, isobutyl ketone, and petroleum-based solvents. These may be used alone or in the form of a mixture. The solvent may be incorporated into the colored composition in an amount ranging from 800 to 4000 parts by mass, preferably from 1000 to 2500 parts by mass for 100 parts by mass of the pigment therein.
(Organic Pigments)

Usable examples of the pigment that is a red pigment include C.I. Pigment Reds 7, 9, 14, 41, 48:1, 48:2, 48:3, 48:4, 81:1, 81:2, 81:3, 97, 122, 123, 146, 149, 168, 177, 178, 179, 180, 184, 185, 187, 192, 200, 202, 208, 210, 215, 216, 217, 220, 223, 224, 226, 227, 228, 240, 246, 254, 255, 264, 272, and 279.

Usable examples of the pigment that is a yellow pigment include C.I. Pigment Yellows 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 144, 146, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 and 214.

Usable examples of the pigment that is a blue pigment include C.I. Pigment Blues 15, 15:1, 15:2, 15:3, 15:4, 15:6, 16, 22, 60, 64, and 80. Of these pigments, C.I. Pigment Blue 15:6 is preferred.

Usable examples of the pigment that is a violet pigment include C.I. Pigment Violets 1, 19, 23, 27, 29, 30, 32, 37, 40, 42, and 50. Of these pigments, C.I. Pigment Violet 23 is preferred.

Usable examples of the pigment that is a green pigment include C.I. Pigment Greens 1, 2, 4, 7, 8, 10, 13, 14, 15, 17, 18, 19, 26, 36, 45, 48, 50, 51, 54, 55 and 58. Of these pigments, C.I. Pigment Green 58 is preferred.

Hereinafter, in the description of pigment species of C.I. Pigments, the species may be abbreviated and described as follows: PB (Pigment Blue), PV (Pigment Violet), PR (Pigment Red), PY (Pigment Yellow), PG (Pigment Green), and others.

The following will describe preparation examples of a colored composition wherein some of the above-mentioned components are used.
(Colored Composition Preparation)
[Pigment Production Example R2]

Into a 1-gallon kneader (manufactured by Inoue Mfg. Inc.) made of stainless steel were charged 100 parts of a diketopyrrolopyrrole type red pigment PR254 ("IRGAFOR RED B-CF" manufactured by Ciba Specialty Chemicals Ltd.: R-1), 18 parts of a colorant derivative (D-1), 1000 parts of pulverized salt, and 120 parts of diethylene glycol, and then these components were kneaded at 60° C. for 10 hours.

This mixture was poured into 2000 parts of hot water, and then stirred in a high-speed mixer for about 1 hour while heated to about 80° C., so as to make the mixture into a slurry form. The slurry was repeatedly subjected to filtration and water washing to remove the salt and the solvent. Thereafter, the resultant was dried at 80° C. for 24 hours to yield 115 parts of a salt-milling-treated pigment (R2).
[Pigment Production Example R3]

Into a 1-gallon kneader (manufactured by Inoue Mfg. Inc.) made of stainless steel were charged 100 parts of an anthraquinone type red pigment PR177 ("CROMOPHTHAL RED A2B" manufactured by Ciba Specialty Chemicals Ltd.), 8 parts of a colorant derivative (D-2), 700 parts of pulverized salt, and 180 parts of diethylene glycol, and then these components were kneaded at 70° C. for 4 hours. This mixture was poured into 4000 parts of hot water, and then stirred in a high-speed mixer for about 1 hour while heated to about 80° C., so as to make the mixture into a slurry form. The slurry was repeatedly subjected to filtration and water washing to remove the salt and the solvent.

Thereafter, the resultant was dried at 80° C. for 24 hours to yield 102 parts of a salt-milling-treated pigment (R3).
[Pigment Production Example R4]

In the atmosphere of nitrogen, 170 parts of tert-amyl alcohol were charged into a sulfonating flask, and thereto were added 11.04 parts of sodium. This mixture was heated to 92-102° C. While the melted sodium was vigorously stirred, the flask was allowed to stand still at 100-107° C. all night.

At 80-98° C. over 2 hours, into the resultant solution was introduced a solution wherein at 80° C. 44.2 parts of 4-chlorobenzonitrile and 37.2 parts of diisopropyl succinate were dissolved in 50 parts of tert-amyl alcohol. After the introduction, this reaction mixture was further stirred at 80° C. for 3 hours, and simultaneously thereto were dropwise added 4.88 parts of diisopropyl succinate.

This reaction mixture was cooled to room temperature, and then added to a mixture composed of 270 parts of methanol, 200 parts of water, and 48.1 parts of concentrated sulfuric acid, and having a temperature of 20° C. This liquid system was continuously stirred at 20° C. for 6 hours. The resultant red mixture was filtrated. The residue was washed with methanol and water, and then dried at 80° C. to yield 46.7 parts of a red pigment (R4).
[Pigment Production Example G2]

Into melted salts of 356 parts of aluminum chloride and 6 parts of sodium chloride were dissolved 46 parts of zinc phthalocyanine, and the solution was cooled to 130° C. The solution was then stirred for 1 hour. The reaction temperature was raised to 180° C., and bromine was dropwise added thereto in an amount of 10 parts per hour over 10 hours. Thereafter, chlorine was introduced thereinto in an amount of 0.8 part per hour over 5 hours.

This reaction liquid was gradually poured into 3200 parts of water, and then filtrated and washed with water to yield 107.8 parts of a crude zinc phthalocyanine chloride. The average number of bromine atoms and that of chlorine atoms contained in each of the molecules of the crude zinc phthalocyanine chloride were 14.1 and 1.9, respectively. For reference, the bromine atom number is not limited by this example.

Into a 1-gallon kneader (manufactured by Inoue Mfg. Inc.) made of stainless steel were charged 120 parts of the resultant crude zinc phthalocyanine chloride, 1600 parts of pulverized salt, and 270 parts of diethylene glycol, and then these components were kneaded at 70° C. for 12 hours.

This mixture was poured into 5000 parts of hot water, and then stirred in a high-speed mixer for about 1 hour while heated to about 70° C., so as to make the mixture into a slurry form. The slurry was repeatedly subjected to filtration and water washing to remove the salt and the solvent. Thereafter, the resultant was dried at 80° C. for 24 hours to yield 117 parts of a salt-milling-treated pigment (G2).
[Pigment Production Example Y2]

Into a separable flask were charged 150 parts of water, and 63 parts of 35% hydrochloric acid were charged thereinto while the water was stirred. In this way, a hydrochloric acid solution was prepared. Thereinto were charged 38.7 parts of benzenesulfonylhydrizide while attention was paid to foaming. Ice was added thereto until the liquid temperature turned to 0° C. or lower. After the system was cooled, thereinto were charged 19 parts of sodium nitrite over 30 minutes. At temperatures between 0 and 15° C., the liquid was stirred for 30 minutes, and then sulfamic acid was charged thereinto until a coloration of a potassium iodide starch paper piece therewith came not to be recognized.

Next, thereto were added 25.6 parts of barbituric acid, and then the temperature of the system was raised to 55° C. While the system was kept as it was, the reaction liquid was stirred for 2 hours. Next, thereto were 25.6 parts of barbituric acid, and the temperature of the system was raised to 80° C. Thereafter, sodium hydroxide was charged thereinto until the pH turned to 5. Furthermore, the liquid was stirred at 80° C. for 3 hours, and the system temperature was lowered to 70° C. The resultant was filtrated and washed with hot water.

The resultant press cake was re-slurried into 1200 parts of hot water, and then the slurry was stirred at 80° C. for 2 hours. Thereafter, the slurry was filtrated while the temperature was kept as it was. The filtrated matter was washed with 2000 parts of hot water of 80° C. temperature. It was then verified that benzenesulfonamide was shifted into the filtrate. The resultant press cake was dried at 80° C. to yield 61.0 parts of a disodium salt of azobarbituric acid.

Next, 200 parts of water were charged into a separable flask, and further 8.1 parts of the resultant disodium salt of azobarbituric acid were charged thereinto while the water was stirred. In this way, the salt was dispersed. After the salt was dispersed to an even state, the temperature of the solution was raised to 95° C. Thereto were added 5.7 parts of melamine, and 1.0 part of diallylaminomelamine. Furthermore, thereto was dropwise added a green solution wherein 6.3 parts of cobalt (III) chloride hexahydrate were dissolved in 30 parts of water over 30 minutes. After the end of the addition, the liquid was subjected to complexing treatment at 90° C. for 1.5 hour.

Thereafter, the pH was adjusted to 5.5, and thereto were added 20.4 parts of a solution wherein 4 parts of xylene, 0.4 part of sodium oleate, and 16 parts of water were beforehand stirred to be made in an emulsion state. Furthermore, this was stirred for 4 hours while heated. The system was cooled to 70° C., and then the resultant was rapidly filtrated. The filtrated matter was repeatedly subjected to washing with hot water at 70° C. until the inorganic salt was able to be washed.

Thereafter, the salt was caused to undergo drying and pulverizing steps to yield 14 parts of an azo yellow pigment (Y2).

[Pigment Production Example B2]

Into a 1-gallon kneader (manufactured by Inoue Mfg. Inc.) made of stainless steel were charged 100 parts of a copper phthalocyanine type blue pigment 15:6 ("LIONOL BLUE ES" manufactured by Toyo Ink Co., Ltd.), 800 parts of pulverized salt, and 100 parts of diethylene glycol, and then these components were kneaded at 70° C. for 12 hours.

This mixture was poured into 3000 parts of hot water, and then stirred in a high-speed mixer for about 1 hour while heated to about 70° C., so as to make the mixture into a slurry form. The slurry was repeatedly subjected to filtration and water washing to remove the salt and the solvent. Thereafter, the resultant was dried at 80° C. for 24 hours to yield 98 parts of a salt-milling-treated pigment (B2).

[Pigment Production Example V2]

Into 3000 parts of 96% sulfuric acid were injected 300 parts of LIONOGEN VIOLET RL (manufactured by Toyo Ink Co., Ltd.), and then the slurry was stirred for 1 hour. Thereafter, the slurry was poured into water of 5° C. temperature. The resultant was then stirred for 1 hour, filtrated, and washed with hot water until the wash liquid turned neutral. The filtrated matter was dried at 70° C.

Into a 1-gallon kneader (manufactured by Inoue Mfg. Inc.) made of stainless steel were charged 120 parts of the resultant acid-pasting-treated pigment, 1600 parts of soda chloride, and 100 parts of diethylene glycol (manufactured by Tokyo Chemical Industry Co., Ltd.), and then these components were kneaded at 90° C. for 18 hours. Next, this mixture was poured into 5 liter of hot water, and then stirred in a high-speed mixer for about 1 hour while heated to about 70° C., so as to make the mixture into a slurry form. The slurry was then filtrated and washed with water to remove sodium chloride and diethylene glycol. Thereafter, the resultant was dried at 80° C. for 24 hours to yield 118 parts of a salt-milling-treated pigment (V2).

(Preparation of Resin Solution (P2))

Into a reactor were put 800 parts of cyclohexanone, and the reactor was heated to 100° C. while nitrogen gas was introduced into the reactor. At the same temperature, a mixture of the following monomers and thermopolymerization initiator was dropwise added thereto over 1 hour to conduct a polymerization reaction:

| | |
|---|---|
| styrene | 70.0 parts, |
| methacrylic acid | 10.0 parts, |
| methyl methacrylate | 65.0 parts, |
| butyl methacrylate | 65.0 parts, and |
| azobisisobutyronitrile | 10.0 parts. |

After the end of the addition, the monomers were further caused to react with each other at 100° C. for 3 hours. Thereafter, thereto was added a solution wherein 2.0 parts of azobisisobutyronitrile were dissolved in 50 parts of cyclohexanone, and further the monomers were caused to react continuously with each other at 100° C. for 1 hour to synthesize a resin solution.

After the system was cooled to room temperature, about 2 g of a sample was taken out from the resin solution. The sample was heated and dried at 180° C. for 20 minutes, and then the resultant nonvolatile matter was measured. Cyclohexanone was added to the previously synthesized resin solution to adjust the content by percentage of the nonvolatile matter to 20%. In this way, an acrylic resin solution (P2) was prepared.

(Preparation of Pigment Dispersed Products and Colored Compositions)

A mixture having each composition (parts by mass) shown in Table 1 described below was stirred and mixed into an even state, and then zirconia beads having a diameter of 1 mm were used to disperse the pigments in a sand mill for 5 hours. Thereafter, the content in the mill was filtrated through a filter having a mesh of 5 μm. In this way, red, green, and blue dispersed products were yielded.

TABLE 1

| Pigment dispersed product | | RP-5 | GP-4 | BP-1 |
|---|---|---|---|---|
| Species | First pigment | R2 | G2 | B1 |
| | Second pigment | R4 | Y2 | V1 |
| | Third pigment | R3 | — | — |
| | Fourth pigment | Y2 | | |
| | Colorant derivative 1 | D-1 | D-3 | D-4 |
| | Colorant derivative 2 | D-2 | | |
| | Colorant derivative 3 | D-3 | | |
| Composition (parts by weight) | First pigment | 0.5 | 8.3 | 9.4 |
| | Second pigment | 4.2 | 5.4 | 0.6 |
| | Third pigment | 3.9 | 0 | 0 |
| | Fourth pigment | 2.1 | | |
| | All colorant derivatives | 1.3 | 1.8 | 1.8 |
| | Acrylic resin solution | 40 | 36.5 | 40.2 |
| | Organic solvent | 48 | 48 | 48 |
| Total | | 100 | 100.0 | 100 |

Thereafter, each of red, green and blue colored compositions was yielded by mixing and stirring a mixture of the pigment dispersed acrylic resin solution (P2), a monomer, a polymerization initiator, a sensitizer, an organic solvent and another as shown in Table 2 described below, and then filtrating the mixture through a filter having a mesh of 5 μm. In Examples described below, the colored compositions in Table 2 were used to form red pixels, green pixels, and blue pixels, respectively.

TABLE 2

| Photosensitive colored composition | RR-5 | GR-4 | BR-1 |
|---|---|---|---|
| Pigment dispersed product (species) | RP-5 | GP-4 | BP-1 |
| Pigment dispersed product (amount) | 34 | 35 | 28 |
| Acrylic resin solution | 13.2 | 12.2 | 19.2 |
| Monomer | 4.0 | 4.8 | 5.6 |
| Photopolymerization initiator | 3.4 | 2.8 | 2.0 |
| Sensitizer | 0.4 | 0.2 | 0.2 |
| Organic solvent | 45.0 | 45.0 | 45.0 |
| Total | 100 | 100 | 100 |

(Coloring Material of Light-Shielding Layer)

A light-shielding color material contained in the light-shielding layer or the black matrix is a coloring material having an absorption in the range of visible ray wavelengths to show a light-shielding function. Examples of the light-shielding coloring material in the invention include organic pigments, inorganic pigments, and dyes. Examples of the inorganic pigments include carbon black, and titanium oxide. Examples of the dyes include azo dyes, anthraquinone dyes, phthalocyanine dyes, quinoneimine dyes, quinolone dyes, nitro dyes, carbonyl dyes, and methine dyes. The organic pigments may be the above-mentioned organic pigments. About the light-shielding component, a single species thereof may be used, or any combination of two or more species thereof may be used at any ratio therebetween. It is also allowable to coat the resin with the surface of such a coloring material to make the resin high in volume resistance; or raise the content by percentage of the coloring material in the base material of the resin to give some quantity of electroconductivity thereto, whereby the resin is reversely made lower in volume resistance. However, the volume resistivity of such a light-shielding material ranges from about $1\times10^8$ to $1\times10^{15}$ $\Omega \cdot cm$; thus, the resistivity is not at a level giving an effect onto the resistance value of the transparent electroconductive film. Similarly, the dielectric constant of the light-shielding layer can be adjusted into the range of 3 to 11 by the selection of the coloring material, or the content by percentage thereof.

(Dispersing Agent and Dispersing Aid)

When a polymeric dispersing agent is used as a dispersing agent for the pigment, the pigment favorably becomes excellent in dispersion stability over time. Examples of the polymeric dispersing agent include urethane dispersing agents, polyethyleneimine dispersing agents, polyoxyethylene alkylene ether dispersing agents, polyoxyethylene glycol diester dispersing agents, sorbitan aliphatic ester dispersing agents, and aliphatic-compound-modified polyester dispersing agents. Particularly preferred is a dispersing agent made of a graft copolymer containing nitrogen atoms for a light-shielding photosensitive resin composition used in the invention and containing a large amount of the pigment from the viewpoint of the developability thereof.

Specific examples of these dispersing agents include EFKA (manufactured by EFKA Co.), Disperbik (manufactured by BYK Japan K.K.), DISPARLON (manufactured by Kusumoto Chemicals, Ltd.), SOLSPERSE (manufactured by Lubrizol Corp.), KP (manufactured by Shin-Etsu Chemical Co., Ltd.), and POLYFLOW (manufactured by Kyoeisha Chemical Co., Ltd.), which are each a trade name. These dispersing agents may be used alone, or may be used in any combination of two or more thereof at any ratio therebetween.

An aid for the dispersion may be, for example, a colorant derivative. Examples of the colorant derivative include azo type, phthalocyanine type, quinacridon type, benzimidazolone type, quinophthalone type, isoindolinone type, dioxazine type, anthraquinone type, indanthrene type, perylene type, perynone type, diketopyrrolopyrrole type, and dioxazine type derivatives. Of these derivatives, quinophthalone type derivatives are preferred.

A substituent of the colorant derivatives is, for example, a sulfonic acid group, a sulfonamide group or a quaternary salt thereof, a phthalimidomethyl group, a dialkylaminoalkyl group, a hydroxyl group, a carboxyl group, or an amide group that is bonded directly or through an alkyl group, an aryl group or a heterocyclic group, or some other group to the skeleton of the pigment. Of these groups, a sulfonic acid group is preferred. About these substituents, two or more thereof may be bonded to a single pigment skeleton.

Specific examples of the colorant derivatives include sulfonic acid derivatives of phthalocyanine, sulfonic acid derivatives of quinophthalone, sulfonic acid derivatives of anthraquinone, sulfonic acid derivatives of quinacridon, sulfonic acid derivatives of diketopyrrolopyrrole, and sulfonic acid derivatives of dioxazine.

The above-mentioned dispersing aids, and colorant derivatives may be used alone, or in any combination of two or more thereof at any ratio therebetween.

EXAMPLE 1

Hereinafter, with reference to FIG. 1, a description will be made about a transflective type liquid crystal display device substrate according to this Example.

(Black-matrix-forming disperse liquid)

In a bead mill dispersing machine were stirred 20 parts by mass of a carbon pigment #47 (manufactured by Mitsubishi Chemical Corp.), 8.3 parts by mass of a polymeric dispersing agent BYK0182 (manufactured by BYK Japan K.K.), 1.0 part by mass of a copper phthalocyanine derivative (manufactured by Toyo Ink Co., Ltd.), and 71 parts by mass of propylene glycol monomethyl ether acetate to prepare a carbon black disperse liquid.

(Black-Matrix-Forming Photoresist)

As a black-matrix-forming resist, the following materials were used:

carbon black disperse liquid: pigment #47 (manufactured by Mitsubishi Chemical Corp.);

resin: V259-ME (manufactured by Nippon Steel Chemical Co., Ltd.) (solid content by percentage: 56.1% by mass);

monomer: DPHA (manufactured by Nippon Kayaku Co., Ltd.);

initiators: OXE-02 (manufactured by Ciba Specialty Chemicals Ltd.), and

OXE-01 (manufactured by Ciba Specialty Chemicals Ltd.);

solvents: propylene glycol monomethyl ether acetate, and ethyl 3-ethoxypropionate; and leveling agent: BYK-330 (manufactured by BYK Japan K.K.).

These materials were mixed with each other and stirred at composition proportions described below to prepare a black-matrix-forming resist (pigment concentration in the solid content: about 20%).

| | |
|---|---|
| Carbon black disperse liquid | 3.0 parts by mass |
| Resin | 1.4 parts by mass |
| Monomer | 0.3 part by mass |
| Initiator OXE-01 | 0.67 part by mass |
| Initiator OXE-02 | 0.17 part by mass |
| Propylene glycol monomethyl ether acetate | 14 parts by mass |
| Ethyl 3-ethoxypropionate | 5.0 parts by mass |
| Leveling agent | 1.5 parts by mass |

(Formation of Black Matrix)

The above-mentioned photoresist was applied onto a transparent substrate 1a made of glass by spin coating, and the workpiece was dried to form a black-matrix-forming coated film. This coated film was dried at 100° C. for 3 minutes. Using an ultrahigh-pressure mercury lamp as a light source, light was then radiated thereto at an exposure value of 200 mJ/cm$^2$ through an exposure photomask having openings giving a pattern width of 20.5 µm (corresponding to a streak width of a black matrix).

Next, the workpiece was developed with a 2.5% solution of sodium carbonate in water for 60 seconds, sufficiently washed with water after the development, and further dried. Thereafter, the workpiece was subjected to heating treatment at 230° C. for 60 minutes to fix the pattern, thereby forming a black matrix 2 (as the above-mentioned black matrix) on the transparent substrate 1a, as illustrated in FIG. 1. This black matrix 2 was a matrix pattern having a streak width of about 20 µm, and having rectangular pixel openings. The film thickness of the black matrix 2 was 1.9 µm. The inclination angle of each end of each of the streaks from the transparent substrate 1a plane was set to about 45 degrees.

(Transparent Electroconductive Film Deposition)

A sputtering machine was used to form an ITO (metal oxide of indium tin) thin film into a film thickness of 0.14 µm to cover the entire front surface of the black matrix 2. This film was named a transparent electroconductive film 3.

(Resin Layer Formation)

Furthermore, a coating liquid of an alkali-soluble acrylic photosensitive resin was used to form a resin layer 4 having concave regions 8 to cover the black matrix 2 and the rectangular openings (pixel regions) in such a manner that the film thickness of the layer 4 would be 0.8 µm after the resin turned into a hard film. The film thickness of the resin layer 4 was set to 0.8 µm. The depth of the concave regions 8 was 0.8 µm, and the transparent electroconductive film 3 was made naked in the concave regions 8.

As an acrylic photosensitive resin coating liquid, a transparent resin coating liquid was used, which was yielded by synthesizing an acrylic resin and further adding monomers and a photo-initiator thereto as described below, and then filtrating the resultant through a filter having a mesh of 0.5 µm.

(Acrylic Resin Synthesis)

Into a reactor were put 800 parts by mass of cyclohexanone. While nitrogen gas was injected thereinto, the reactor was heated. Thereto was dropwise added a mixture of the following monomers and thermopolymerization initiator to conduct a polymerization reaction:

| | |
|---|---|
| styrene | 55 parts by mass, |
| methacrylic acid | 65 parts by mass, |
| methyl methacrylate | 65 parts by mass, |
| benzyl methacrylate | 60 parts by mass, |
| thermopolymerization initiator | 15 parts by mass, and |
| chain transfer agent | 3 parts by mass. |

After the addition of the mixture and a sufficient heating thereof, thereto was added a solution yielded by dissolving 2.0 parts by mass of the thermopolymerization initiator into 50 parts by mass of cyclohexanone. The reaction was further continued to yield a solution of an acrylic resin.

Cyclohexanone was added to this acrylic resin solution to give a solid content by percentage of 30% by mass to prepare an acrylic resin solution. This was named a resin solution (1).

The weight-average molecular weight of the acrylic resin was about 20,000.

Furthermore, a mixture having the following composition was stirred and mixed to an even state; and then glass beads having a diameter of 1 mm were used to disperse, in a sand mill, dispersible components therein for 2 hours, and the resultant was then filtrated through a filter having a mesh of 0.5 µm to yield a transparent resin coating liquid:

| | |
|---|---|
| resin solution (1) | 100 parts by mass; |
| polyfucnitonal polymerizable monomer EO-modified bisphenol A methacrylate (BPE-500, manufactured by Shin-Nakamura Chemical Co., Ltd.) | 20 parts by mass; |
| photo-initiator ("IRGACURE 907", manufactured by Ciba Specialty Chemicals Ltd.) | 16 parts by mass; and |
| cyclohexanone | 190 parts by mass. |

(Light Scattering Layer Formation)

A photosensitive light-scattering-layer-forming resin composition was prepared to have the following composition:

| | |
|---|---|
| alkali-soluble photosensitive transparent resin A: an epoxy acrylate resin having a fluorene skeleton | 4.5 parts by mass; |
| transparent particles B3: MX150 (manufactured by Soken Chemical & Engineering Co., Ltd.) | 2 parts by mass; |
| photopolymerization initiator C: IRGACURE 819 (manufactured by Ciba Specialty Chemicals Ltd.) | 0.45 part by mass; |
| solvent D: cyclohexanone | 21 parts by mass; and |
| photopolymerizable monomer E: M400 (manufactured by Toagosei Co., Ltd.) | 2 parts by mass. |

The transparent resin A, the photopolymerization initiator C, and the photopolymerizable monomer E were mixed with each other, and the mixture was coated, exposed to light (200 mJ/cm$^2$), developed, and made into a hard film at 230° C. for 60 minutes. Thereafter, the refractive index of the transparent resin was 1.58 (D line, 589 nm).

The transparent resin A, the transparent particles B, the photopolymerization initiator C, the solvent D, and the photopolymerizable monomer E were mixed with each other to set the ratio by weight of A/B/C/D/E to 4.5/2/0.45/21/2, and stirred in a medium-free dispersing machine for 3 hours. In this way, a light-scattering-layer-forming resin composition was yielded. At this time, the viscosity of the composition was 14 cp at 25° C.

Next, a coated film of the light-scattering-layer-forming resin composition was formed to cover the resin layer 4. Using a photomask having a pattern for a light scattering layer, ultraviolet rays were radiated to the coated film at 200 mJ/cm$^2$. The workpiece was developed with an alkaline developer, and then subjected to heat treatment at 230° C. for 40 minutes to turn the coated film to a hard film. In this way, a light scattering layer 5 was formed as illustrated in FIG. 1. The position of the pattern of the light scattering layer 5 was over a reflection region R of each pixel. As illustrated in FIG. 7B, the pattern was arranged along the longitudinal direction of the pixel, which is a rectangular pixel 31, and on the individual long-side sides of the black matrix 2. In this way, a substrate for a transflective type liquid crystal display device (BM substrate) was yielded wherein the height of each convex region 7 over the black matrix from the front surface of the light scattering layer 5 was 1.3 µm.

Figure 7A:
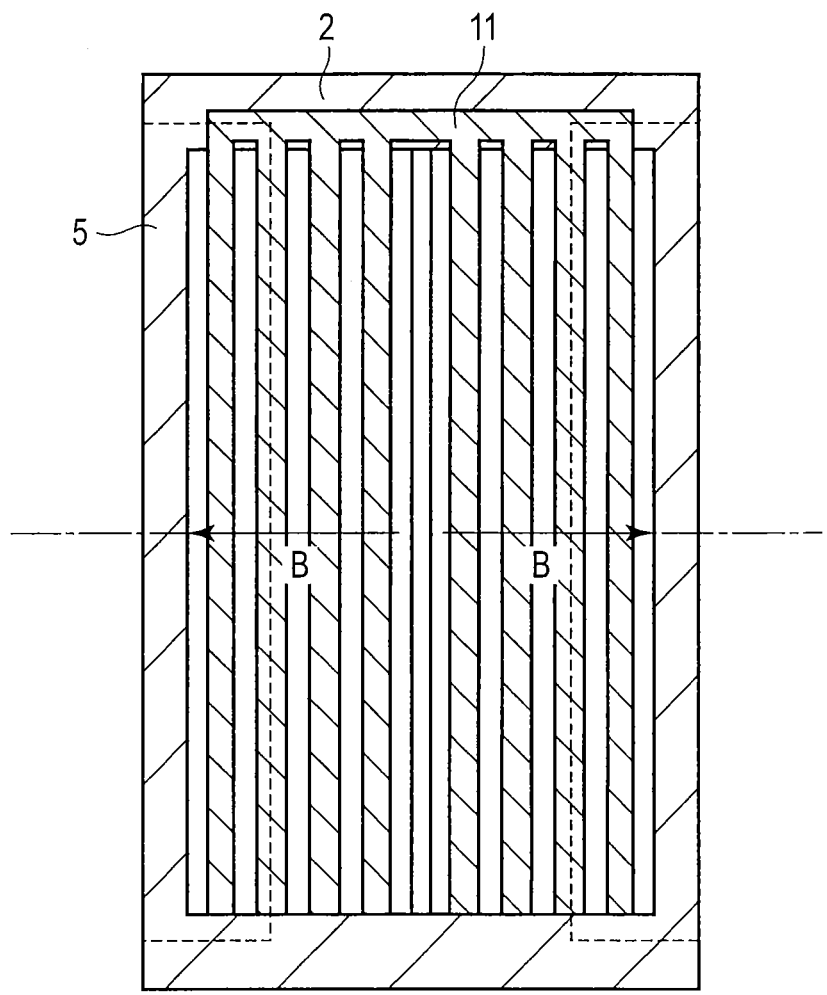
FIG. 7A is a plan view illustrating an example of a pattern of a first electrode of one pixel of a liquid crystal display device according to an embodiment of the invention when the pixel is viewed in plan.

In the transflective type liquid crystal display device, an example of the shape of a first electrode 11 of an array substrate to be laminated to the BM substrate is illustrated in FIG. 7A. Illustration of the second electrode is omitted. The directions in which the liquid crystals are inclined when the liquid crystal cells were formed are represented by arrows B.

The transflective type liquid crystal display device substrate (BM substrate) according to this Example may be applied to a liquid crystal display device of a so-called COA mode, wherein a color filter is formed to the array substrate side, or a transflective type color liquid crystal display device of a field sequential mode (of using LED light sources in plural colors as a backlight to make a color display, without using the color filter, by driving the light sources in a time-sharing manner).

In this Example, the light scattering layer 5, wherein the film thickness of the reflection region was 1.8 µm, was used as the cell gap adjusting layer. It is however allowable to use, instead of the light scattering layer 5, a ¼-wavelength layer, or remove the resin layer only under the reflection region R, form the ¼-wavelength layer in these region, and further laminate the light scattering layer 5 via electroconductive film 3.

The thickness of the liquid crystal layer of the transmission region of the transflective type liquid crystal display device to which the BM substrate according to this Example is applied is 3.6 µm, which is a thickness two times that of the cell gap adjusting layer (the light scattering layer 5 in the Example), which is 1.8 µm. The thickness of the liquid crystal of the reflection region is 1.8 µm. This Example can cope with various thicknesses of the liquid crystal layer by adjusting the thickness of the cell gap adjusting layer, or a height of a spacer (a column formed for the transparent resin, the color layer or some other to regulate the thickness of the liquid crystal layer in the transmission regions) set together to the liquid crystal display device substrate.

EXAMPLE 2

In Example 1, the directions in which the liquid crystal molecules are inclined when the BM substrate and the array substrate are laminated to each other to make the cells are directions along respective short sides of the rectangular openings (directions reverse to each other between the ½-pixels in each of the pixels) when the device is viewed in plan. In Example 2, a description is made about a pattern structure of a BM substrate when the direction in which liquid crystals are inclined is a direction varied by 90 degrees between ¼-pixels of each rectangular pixel.

The material and the process used for forming the BM substrate were the same as in Example 2.

Figure 8A:
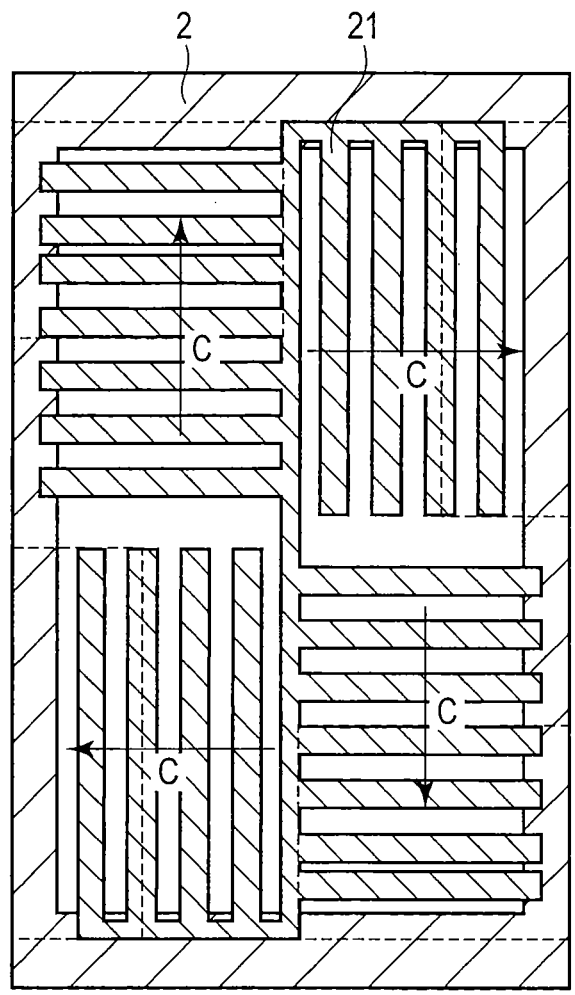
FIG. 8A is a plan view illustrating an example of a pattern of a first electrode of one pixel of a liquid crystal display device according to another embodiment of the invention when the pixel is viewed in plan.
Figure 8B:
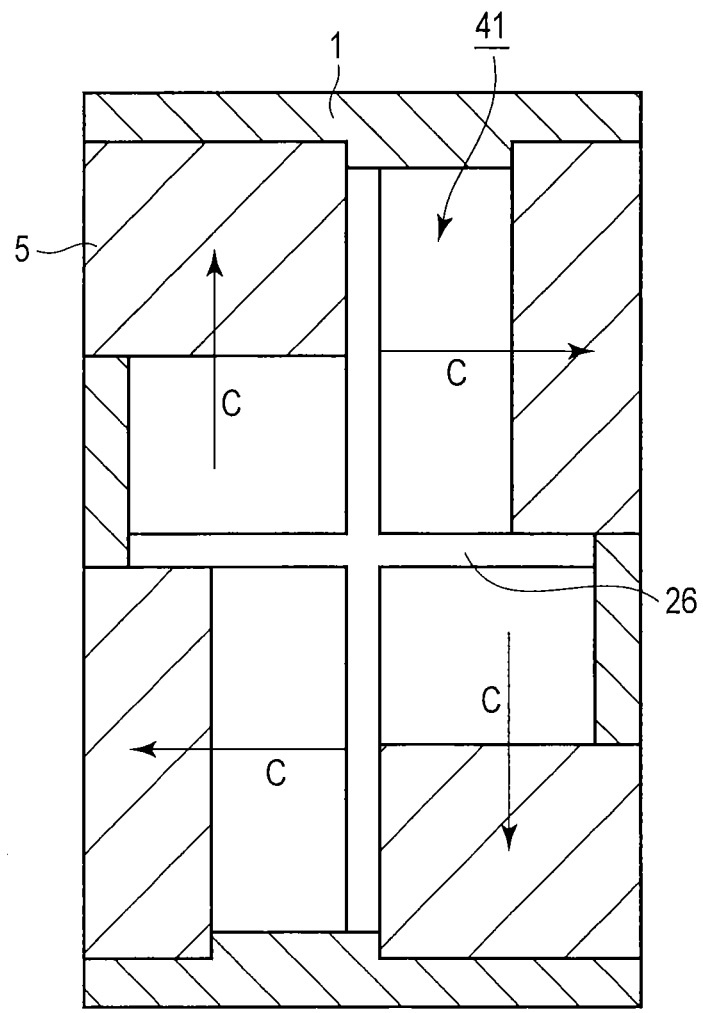
FIG. 8B is a plan view illustrating an example of a pattern of a black matrix and a light scattering layer of one pixel of a liquid crystal display device according to another embodiment of the invention when the pixel is viewed in plan.

As illustrated in FIG. 8B, the position of a pattern of the light scattering layer 5 was rendered a position as illustrated in FIG. 8B, where the pattern was overlapped partially with the black matrix 2 along the respective directions of the sides of any one 41 out of rectangular pixels, and further the pattern was centrosymmetrical about a center of a cross-form concave region 26 of the rectangular pixel 41 when the pattern was viewed in plan. The height H illustrated in FIG. 1 was set to 1.3 µm, which was the height of the convex region 7 above the black matrix from the front surface of the light scattering layer 5 in the reflection region R.

In FIG. 8A is illustrated an example of the shape of a first electrode 21 of an array substrate which was laminated to the BM substrate yielded as described above to form a transflective type liquid crystal display device. Illustration of its second electrode is omitted. A pattern of the second electrode was made, when viewed in plan, into the form of being protruded from the pattern of the first electrode into the respective directions of the sides of the black matrix 2 (directions of arrows C) in each of the ¼-pixels. The directions in which the liquid crystals were inclined when the liquid crystal cells are formed, are represented by the arrows C. The depth of the concave region 26 was set to 0.8 µm, which was equal to that in Example 1. In FIG. 8A, the black matrix and a light scattering layer set to the BM substrate are represented by broken lines.

EXAMPLE 3

Figure 9:
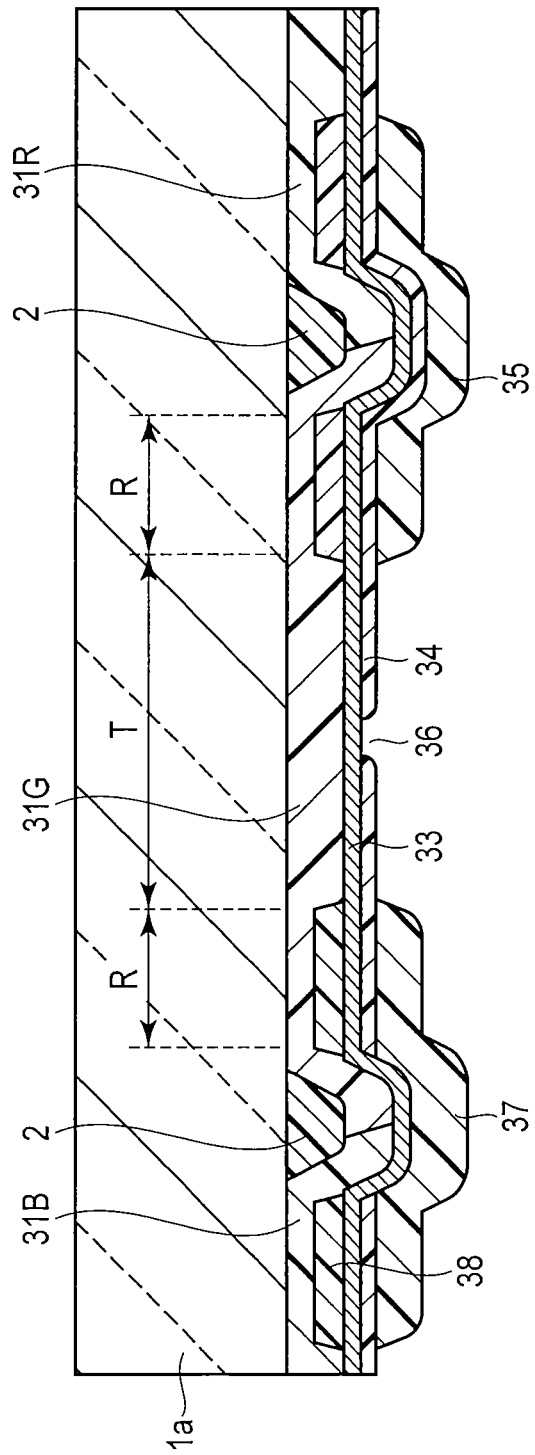
FIG. 9 is a sectional view of a liquid crystal display device substrate according to a third embodiment of the invention.

In Example 3, with reference to FIG. 9, a description is made about a transflective type liquid crystal display device substrate as a color filter substrate having red pixels, green pixels, and blue pixels.

In Example 3, the same black-matrix-forming disperse liquid as in Example 1 was used to form a black matrix 2 through the same process, and then red, green and blue pixels, examples thereof are a red pixel 31R, a green pixel 31G and a blue pixel 31B, respectively, were formed in openings (rectangular pixels) in the black matrix 2 by use of a red colored composition, a green colored composition, and a blue colored composition, respectively. The used colored compositions were the same as shown in Table 2 described above.

An exposure mask used for forming the color pixel in the reflection region R illustrated in FIG. 9 was a gray tone photomask (photomask giving a difference in transmittance to between the transmission region T of each of the color pixels and the reflection region R). As a result, the thickness of the color layer in the reflection region R was set to 1.6±0.2 µm, which was about ½ of that of the transmission region T.

The respective film thicknesses of portions of the color layer (including the red pixel 31R, the green pixel 31G and the blue pixel 31B) formed directly to the transparent substrate were each set to 3.2±0.2 µm. Over the black matrix along the longitudinal direction of the rectangular pixel, two (for example, red-green, green-blue, and red-blue) of the colors were laminated with each other to adjust the height of the convex region 37. The adjustment of the height of the convex region 37 by the color-laminating may be attained by adjusting the viscosities of the colored compositions, a condition for the coating, the streak width of the black matrix, the width of the color-laminated portion, and others. In this Example, a wall of the color pixel was formed with a height of 1.6 µm in order to surround the color pixel of the reflection region R. Thus, in the formation of the aligned film by ink-jetting, which will be next described, ink droplets would not flow out from the concave region at a time of a strike of the droplets. Thus, the aligned film would be able to be formed by the printing.

Next, for pre-treatment before the formation of a ¼-wavelength layer 38, alignment treatment was conducted as follows: for the pre-treatment for the front surface of the color pixels to form the ¼-wavelength layer 38, an aligned film material (SANEVER, manufactured by Nissan Chemical Industries, Ltd.) which was adjusted for the viscosity of the aligned film material was used and jetted out selectively onto the color pixel of the reflection region R from an inkjet printing device to give a dry film thickness of 0.1 µm.

In order to jet out ink precisely without causing non-jetting-out, misdirection or mist in the inkjet, it is necessary to control a rheological property when the ink is not jetted out. About the rheological property giving an excellent jetting-out property to the ink filled into the ink-jet, the initial value of the complex viscosity coefficient of the ink is 20 mPa·s or less at 23 to 25° C. when the frequency is changed from 100 to 0.1 Hz, the maximum value thereof is 1000 mPa or less, and at a frequency of 10 to 50 Hz, the tangent loss is from 1 to 20. About the jetted-out amount from nozzles of the ink-jet, the jetted-out amount per pixel was set into the range of 2 to 10 μL (picoliters) for each of times of the jetting-out.

Furthermore, the workpiece was heated and dried on a hot plate at 90° C. for 1 minute, and then baked in a clean oven at 260° C. for 40 minutes to harden the printed film. Subsequently, this hardened printed film was subjected to rubbing treatment into a predetermined direction. In this way, the pre-treatment was completed.

Onto the color pixels in the reflection regions R subjected to the pre-treatment was formed a retardation layer having a retardation function of varying a wavelength by ¼ thereof, that is, as the ¼-wavelength layer 38, so as to have a film thickness of 1.6±0.1 μm. A method for forming this ¼-wavelength layer 38 is as follows:

First, a mixture having a composition described below was stirred and mixed into an even state, and filtrated through a filter having a mesh of 0.6 μm. The resultant polymerizable liquid crystal compound was coated onto the color pixels subjected to the pre-treatment to have a dry film thickness of 1.6 μm. The workpiece was heated and dried on a hot plate at 90° C. for 2 minutes.

| | |
|---|---|
| Horizontal alignment polymerizable liquid crystal ("Paliocolor LC 242", manufactured by BASF Japan Ltd.) | 39.7 parts |
| Photopolymerization initiator ("IRGACURE 907", manufactured by Ciba Specialty Chemicals Ltd.) | 0.3 part |
| Surfactant (2% solution of cyclohexanone: "BYK 111", manufactured by BYK Japan K.K.) | 6.0 parts |
| Cyclohexanone | 154.0 parts |

Next, an exposure apparatus having a semiconductor laser as a light source was used to expose the substrate on which this polymerizable liquid crystal compound was coated to ultraviolet rays through a photomask, so as to give the rays successively and separately to the individual color pixel regions in the reflection regions. The radiation value of the ultraviolet rays were set to 500 mJ/cm² for each of the red pixel regions, 200 mJ/cm² for each of the green pixel regions, and 5 mJ/cm² for each of the blue pixel regions by changing the number of shots of the laser. The workpiece was further subjected to developing treatment to form a pattern of the ¼-wavelength layer 38.

Subsequently, the substrate was put into a clean oven, and baked at 230° C. for 40 minutes to yield a color filter substrate wherein the ¼-wavelength layer 38 was formed.

The total retardation of the color pixels and the retardation layer of the resultant color filter substrate was measured. As a result, the value thereof was 166 nm in the red pixel regions according to a light ray having a wavelength of 630 nm; that was 136 nm in the green pixel regions according to a light ray having a wavelength of 550 nm; and that was 112 nm in the blue pixel regions according to a light ray having a wavelength of 450 nm. In other words, it is understood that the total retardation of the color pixels and the retardation layer are satisfied the following relationship: the total retardation in the red pixels≥the total retardation in the green pixels≥the total retardation in the blue pixels.

The results are shown in Table 3 described below.

TABLE 3

| Region | | Red pixels | Green pixels | Blue pixels |
|---|---|---|---|---|
| Exposure value of retardation layer | | 500 mJ | 200 mJ | 5 mJ |
| Measured wavelength of retardation | | 630 nm | 550 nm | 450 nm |
| Retardation | Color filter (CF) layer | 3 nm | 0 nm | 0 nm |
| | CF layer + retardation layer | 164 nm | 136 nm | 112 nm |
| | Retardation layer | 161 nm | 136 nm | 112 nm |
| Film thickness of retardation layer | | 1.6 μm | 1.6 μm | 1.5 μm |
| Birefringence of retardation layer | | 0.100 | 0.085 | 0.072 |

(Transparent Electroconductive Film Deposition)

A sputtering machine was used to form an ITO (thin film of metal oxides of indium and tin) into a film thickness of 0.14 μm to cover the whole front surfaces of the color pixels and the retardation layer. This thin film was named a transparent electroconductive film 33.

(Formation of Resin Layer)

Furthermore, the same alkali-soluble acrylic-photosensitive-resin-coating liquid as in Example 1 was used to form a resin layer 34 to cover the black matrix 96 and the rectangular pixels (color pixels) in such a manner that the resin layer 34 would have a film thickness of 0.8 μm after turned to a hard film. The film thickness of the resin layer 34 was adjusted to 0.8 μm. The depth of any one 36 out of concave regions was 0.8 μm, and the transparent electroconductive film 33 was made naked in the concave region 36.

(Light Scattering Layer/Cell Gap Adjusting Layer)

Next, the above-mentioned light scattering layer composition was used to form a light scattering layer (cell gap adjusting layer) 35 into a film thickness of 1.9 μm. In the method for the formation, a photomask having a pattern of the light scattering layer was used to expose the workpiece to ultraviolet rays at 200 mJ/cm², and the workpiece was developed with an alkaline developer, and then thermally treated at 230° C. for 40 minutes to turn the film of the composition to a hard film. The exposure and the thermal treatment resulted to the stabilization of the ¼-wavelength layer 38 laid under the light scattering layer 35 by the additional hard film. The stacking of the light scattering layer 35 made it possible to overcome a blocking of the ¼-wavelength layer 38 with oxygen to stabilize this layer by film-hardening re-treatment including exposure to ultraviolet rays. Since the ¼-wavelength layer 38 was made hard by the thermal treatment after the thin-film color pixels were beforehand laid in the reflection regions in this Example, the layer was able to be formed to have a good shape without being deformed notwithstanding any difference in the exposure value.

EXAMPLE 4

(Production of Liquid Crystal Display Device)

Figure 10:
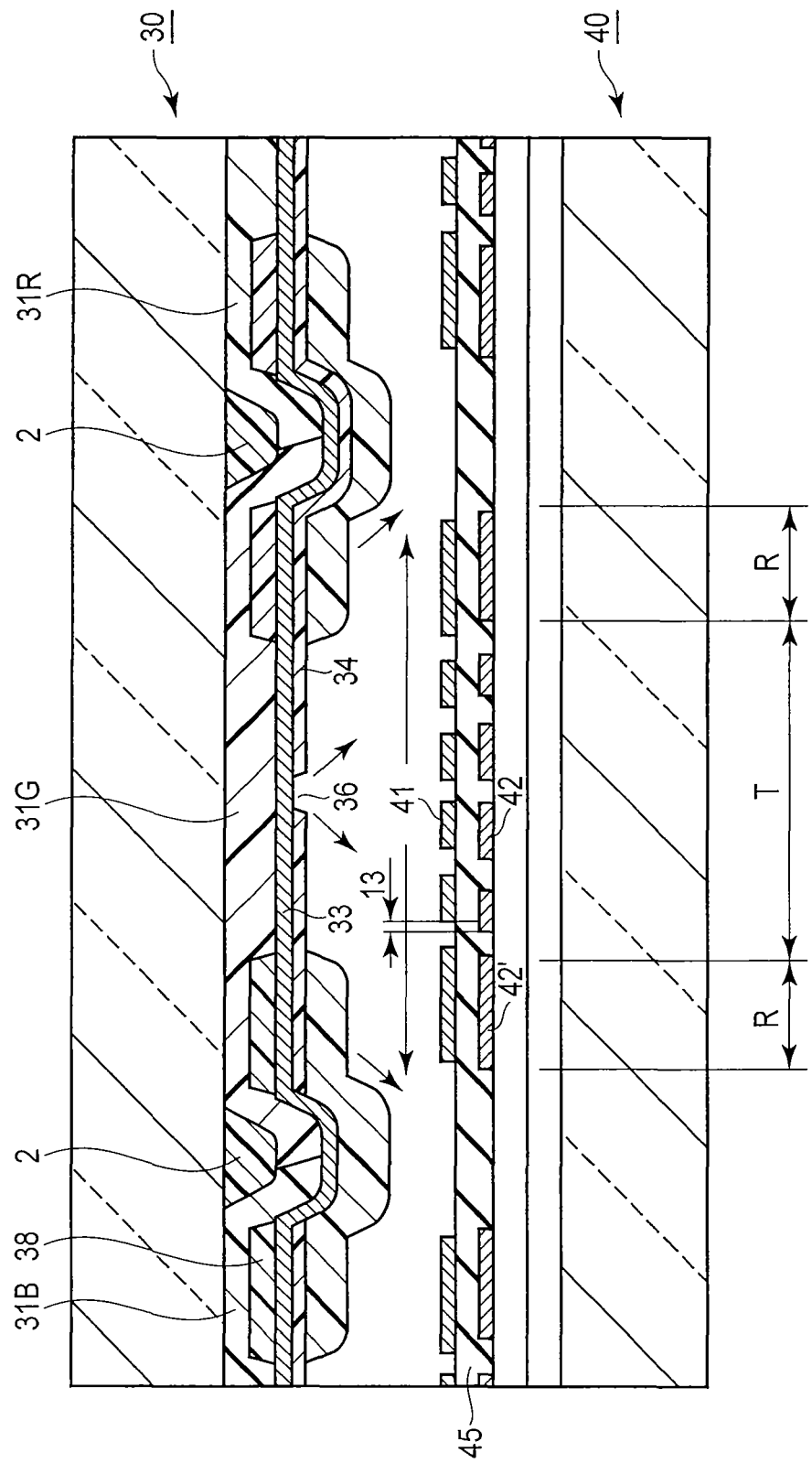
FIG. 10 is a sectional view of a liquid crystal display device according to a fourth embodiment of the invention.

With reference to FIG. 10, a description is made about a liquid crystal display device according to this Example.

In this Example, the liquid crystal display device was produced, using: an array substrate 40 including comb-teeth-form pixel electrodes that was a first electrode 41 and a second electrode 42 via an insulating layer 45; and the transflective type liquid crystal display device substrate 30 having the same structure as Example 3. Omitted is illustration of the polarizing plate and retardation plate attached to the outside surface of the liquid crystal display device, and a backlight source. FIG. 10 is a partial sectional view of the transflective type liquid crystal display device.

In the transflective type liquid crystal display device substrate 30 used in this Example, the transparent electroconductive film 33 is formed over the black matrix 2; thus, when the liquid crystal display device is formed, the liquid crystal display device has an advantage that the transparent electroconductive film 33 becomes nearer the first electrode 41 of the array substrate side by a distance corresponding to the film thickness of the black matrix 2, so that an oblique electric field is smoothly made as represented by arrows in FIG. 10. For the formation of the oblique electric field by the first electrode 41, the film thickness of the black matrix 2 can be adjusted.

About the liquid crystal display device according to this Example, the image display thereof is also very even and good. The alignment of the liquid crystal is neither disturbed in the vicinity of each of the color pixels nor at boundaries between the light-shielding layer and the display region. Thus, the resultant liquid crystal display device gives a high image quality without causing light leakage.

About the second electrode 42, it is desired to form any transmission region T thereof as a transparent electroconductive thin film made of ITO or some other, and form any reflection region R thereof as a second electrode 42' that is a metal film made of an aluminum alloy or some other. The first and second electrodes may each be formed into a comb-teeth-form pattern. The second electrode in this Example was equal in the potential to the transparent electroconductive film, which was a third electrode 3.

The potential of the transparent electroconductive film described in each of Examples 1 to 3 may be lowered to the ground potential, or made equal to that of the common electrode when the liquid crystals are driven.

EXAMPLE 5

The transflective type liquid crystal display device substrate used in Example 5 had the same structure as that used in Example 3. As illustrated in FIG. 11, in Example 5, use was made of an array substrate 50 wherein a first electrode 51 and a second electrode 52 were each made into a comb-teeth-form pattern made of ITO, which is an electroconductive metal oxide.

Under the first electrode 51 and the second electrode 52, a light-reflective reflective film 53 was laid to have the size of each reflection region R. The reflective film 53 and a gate interconnect made of an aluminum alloy were formed in the same step. However, these were electrically isolated from each other.

In this Example, the respective pattern forms of the first electrode 51 and the second electrode 52 in the reflection regions can be flexibly modified; thus, the Example is better in Example 4.

In the various embodiments and examples that have been described above, the liquid crystal alignment mode is not limited to a vertical alignment mode. For example, various retardation functions are obtained by varying the thickness or the Δnd of their retardation layer, or various retardation layers are obtained by alignment adjustment based on optical alignment or rubbing; thus, the present invention can cope with liquid crystal display devices in various alignment modes. The dielectric constant anisotropy of a liquid crystal material adoptable in the invention may be positive or negative. It is proper to adopt the liquid crystals having the negative dielectric constant anisotropy since alignment treatment for an aligned film (to be used) can be omitted.

The above-mentioned Examples each have a structure wherein a resin layer and a light scattering layer are laminated above a transparent electroconductive film.

However, instead of the light scattering layer, a ¼-wavelength layer or ½-wavelength layer may be laminated. The light scattering layer may be substituted with, for example, a reflective film disclosed in Patent Literature 5 described above, which has irregularities and formed to a reflective region of an array substrate side. In FIGS. 10 and 11, omitted is illustration of a TFT element, and metal interconnects such as gate interconnect and source interconnect. For example, Jpn. Pat. Appln. KOKAI Publication No. 2009-105424 discloses a technique of forming each of a gate interconnect and a source interconnect as a single layer made of an aluminum alloy so as to include a low-level contacting property with ITO.

The straightly linear concave region or cross-form concave region may be formed as a light-shielding pattern having the same shape onto an array substrate side, which is faced to the transflective type liquid crystal display device substrate, by use of an electrically independent metal pattern. Furthermore, each of the respective pixels of the liquid crystal display devices is divided, through its linear concave region, into linearly symmetric ½-pixels or centrosymmetrical ¼-pixels. However, when 2 or 4 TFTs are formed for each of the pixels and further a driving mode of applying different voltages to the individual TFTs is used, a three-dimensional image can be displayed. It is allowable to form 2 TFTs for each of the pixels, drive the liquid crystals in the reflection region using one of the TFTs, and drive the liquid crystals in the transmission region using the other TFT. In accordance with the size of the liquid crystal display device or a use purpose thereof, the first electrode or second electrode that has the comb-teeth-form pattern may be appropriately adjusted about the number of the teeth in the pixel opening width direction, the density of the teeth, the interval therebetween, and the arrangement thereof.

What is claimed is:

1. A transflective type liquid crystal display device substrate, comprising:
    a transparent substrate;
    a black matrix formed above the transparent substrate, and having openings that divide rectangular pixels, respectively;
    a transparent electroconductive film formed above the transparent substrate and the black matrix;
    a resin layer formed above the transparent electroconductive film, and having a concave region at a center of each of the pixels; and
    a cell gap adjusting layer formed partially above the resin layer, and forming convex regions with the resin layer above the black matrix;
    wherein the rectangular pixels are each formed symmetrically to a center that is the concave region of the resin layer, and each formed to have a transmission region and a reflection region in an order that from a position near the center; in the transmission region, the resin layer is laminated above the transparent electroconductive film; and in the reflection region, the resin layer and the cell gap adjusting layer are laminated above the transparent electroconductive film.

2. The transflective type liquid crystal display device substrate of claim 1,
    wherein a level A of a height of a front surface of the resin layer from a front surface of the transparent substrate above the black matrix, a level B of a height of a front surface of the resin layer in the reflection region therefrom, and a level C of a height of a front surface of the resin layer in the transmission region therefrom satisfy a relationship of A>B>C, and a level of a bottom of the concave region of the resin layer is lower than the respective levels A, B and C of the front surfaces of the resin layer.

3. The transflective type liquid crystal display device substrate of claim 1,
wherein a thickness of the cell gap adjusting layer is about ½ of a thickness of a liquid crystal layer of the liquid crystal display device.

4. The transflective type liquid crystal display device substrate of claim 1,
wherein the cell gap adjusting layer is a light scattering layer.

5. The transflective type liquid crystal display device substrate of claim 1,
wherein the cell gap adjusting layer is a ¼-wavelength layer.

6. A liquid crystal display device, comprising:
the liquid crystal display device substrate of claim 1;
a liquid crystal layer; and
an array substrate arranged oppose to the liquid crystal display device substrate via the liquid crystal layer, and comprising elements arranged in a matrix form to drive liquid crystal molecules of the liquid crystal layer;
wherein the array substrate comprises first and second electrodes different in electric potential from each other to drive the individual rectangular pixels.

7. The liquid crystal display device of claim 6,
wherein motions of the liquid crystals are motions that at a time of liquid-crystal-drive-voltage applying, the liquid crystals are inclined centrosymmetrically or linearly symmetrically from the concave region at the center of each of the rectangular pixels to directions into sides of the black matrix when viewed in plan.

8. The liquid crystal display device of claim 6,
wherein motions of the liquid crystals in each of the rectangular pixels at a time of liquid-crystal-drive-voltage applying are motions divided into 4 by straight lines passing through a cross-form concave region at the center of the rectangle pixel when viewed in plan.

9. The liquid crystal display device of claim 6,
wherein the first electrode has a comb-teeth-form pattern connected to an active element for driving the liquid crystals; the second electrode has a comb-teeth-form pattern equivalent to that of the first electrode, and is comprised below the first electrode via an insulating layer; and the pattern of the second electrode is protruded from the pattern of the first electrode into a direction along which the liquid crystals are inclined.

10. The liquid crystal display device of claim 6,
wherein the first and second electrodes each comprise electroconductive metal oxides which are transparent in a range of visible wavelengths.

11. The liquid crystal display device of claim 6,
wherein the liquid crystals are liquid crystals having a negative dielectric constant anisotropy.

12. A transflective type liquid crystal display device substrate, comprising:
a transparent substrate;
a black matrix formed above the transparent substrate, and having openings that divide rectangular pixels, respectively;
a color layer formed above the transparent substrate and the black matrix, and forming the rectangular pixels;
a transparent electroconductive film formed above the color layer;
a resin layer formed above the transparent electroconductive film, and having a concave region at a center of each of the pixels; and
a cell gap adjusting layer formed partially above the resin layer, and forming convex regions with the resin layer above the black matrix;
wherein the rectangular pixels are each formed symmetrically to a center that is the concave region of the resin layer, and each formed to have a transmission region and a reflection region in an order that from a position near the center; in the transmission region, the resin layer is laminated above the transparent electroconductive film; and in the reflection region, the resin layer and the cell gap adjusting layer are laminated above the transparent electroconductive film.

13. The transflective type liquid crystal display device substrate of claim 12,
wherein a thickness of the color layer located in the reflection region is about ½ of a thickness of the color layer located in the transmission region.

14. The transflective type liquid crystal display device substrate of claim 12,
wherein a ¼-wavelength layer is laminated above the color layer in the reflection region, and a light scattering layer is laminated above the ¼-wavelength layer via the transparent electroconductive film.

15. The transflective type liquid crystal display device substrate of claim 12,
wherein a light scattering layer is laminated above the color layer in the reflection region, and a ¼-wavelength layer is laminated above the light scattering layer via the transparent electroconductive film.

* * * * *